(12) United States Patent
Kobayashi et al.

(10) Patent No.: US 7,985,619 B2
(45) Date of Patent: Jul. 26, 2011

(54) MANUFACTURING METHOD FOR SEMICONDUCTOR DEVICE EMBEDDED SUBSTRATE

(75) Inventors: Toshio Kobayashi, Nagano (JP); Tadashi Arai, Nagano (JP); Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 16 days.

(21) Appl. No.: 12/608,383

(22) Filed: Oct. 29, 2009

(65) Prior Publication Data
US 2010/0112802 A1    May 6, 2010

(30) Foreign Application Priority Data
Oct. 30, 2008   (JP) ................................ 2008-280168

(51) Int. Cl.
*H01L 21/00*    (2006.01)
(52) U.S. Cl. ............ 438/107; 438/26; 438/63; 438/125; 257/E21.499; 257/E21.505; 257/E21.511
(58) Field of Classification Search .................... 438/55, 438/63; 257/E21.512, E21.513
See application file for complete search history.

(56) References Cited

U.S. PATENT DOCUMENTS
2006/0202353 A1*  9/2006  Wakabayashi et al. ....... 257/780

FOREIGN PATENT DOCUMENTS
| JP | 2842378 | 10/1998 |
| JP | 2005-332887 | 12/2005 |
| JP | 4121542 | 5/2008 |

* cited by examiner

*Primary Examiner* — Cheung Lee
(74) *Attorney, Agent, or Firm* — Drinker Biddle & Reath LLP

(57) ABSTRACT

A manufacturing method for a semiconductor device embedded substrate, includes: a first step of preparing a semiconductor device having a first insulating layer; a second step of preparing a support body, and arranging the semiconductor device on one surface of the support body; a third step of forming a second insulating layer on the one surface of the support body; a fourth step of removing the support body; a fifth step of forming a first wiring pattern on a surface of each of the first insulating layer and the second insulating layer; a sixth step of forming a via-hole from which the first wiring pattern is exposed on the second insulating layer; and a seventh step of forming a second wiring pattern electrically connected on a surface of the second insulating layer.

5 Claims, 24 Drawing Sheets

US 7,985,619 B2

MANUFACTURING METHOD FOR SEMICONDUCTOR DEVICE EMBEDDED SUBSTRATE

CROSS-REFERENCE TO RELATED APPLICATION

This application is based on and claims priority under 35 U.S.C. §119 from Japanese Patent Application No. 2008-280168 filed on Oct. 30, 2008.

BACKGROUND OF THE INVENTION

1. Technical Field

The invention relates to a manufacturing method for a semiconductor device embedded substrate in which a semiconductor device is embedded.

2. Related Art

Hitherto, a wiring substrate (hereinafter referred to as a semiconductor device embedded substrate), in which a semiconductor device is embedded, has been known. For example, the following method (see, e.g., Patent Document 1) has been known as a manufacturing method for a semiconductor device embedded substrate. That is, bumps serving as connection terminals to be electrically connected to a semiconductor integrated circuit which a semiconductor device has are formed in the semiconductor device. Then, the bumps are embedded in a wiring substrate. An insulating layer is applied around the semiconductor device. Subsequently, the bumps are exposed by drilling the insulating layer with a laser. Then, a wiring pattern (rewiring-wire) is formed on the exposed bumps.

In addition, another method (see, e.g., Patent Document 2) has been known, which includes a first step of forming bumps serving as connection terminals to be electrically connected to a semiconductor integrated circuit that a semiconductor device has, a second step of forming an insulating layer on bumps, a third step of drilling the insulating layer with laser to thereby form via-holes that reach the bumps, and a fourth step of forming a via wire, with which each via hole is filled, and a wiring pattern (rewiring-wire) to be connected to the via wire. This method uses the bumps as laser stopper layers when via-holes are formed.

Patent Document 1 Japanese Patent No. 2842378
Patent Document 2 JP-A-2005-332887

However, according to the conventional manufacturing methods for a semiconductor device, an insulating layer is formed on a semiconductor device to hide bumps serving as connection terminals which connect a wiring pattern (rewiring-wire) with a semiconductor integrated circuit that the semiconductor device has. Then, the semiconductor device is embedded in the substrate. In addition, the bumps are exposed by drilling the insulating layer with a laser. Thus, the conventional manufacturing methods have problems that it takes time to perform the step of drilling the insulating layer with a laser, and that the manufacturing cost of the semiconductor device embedded substrate is increased.

The conventional manufacturing methods have another problem that because laser beams having a predetermined spot diameter (the diameter is about, e.g., 70 μm) are irradiated, the interval of the bumps serving as connection terminals for electrically connecting the wiring pattern (rewiring-wire) to the semiconductor integrated circuit that the semiconductor device has is reduced only to about 150 μm.

In view of the above respects, the problem that the invention is to resolve is to provide a manufacturing method for a semiconductor device embedded substrate, which can suppress increase of the manufacturing cost thereof and extremely reduce the interval of connection terminals for electrically connecting a wiring pattern (rewiring-wire) to a semiconductor integrated circuit that the semiconductor device has.

SUMMARY OF THE INVENTION

According to a first aspect of the invention, there is provided a manufacturing method for a semiconductor device embedded substrate, including:

a first step of preparing a semiconductor device that has a semiconductor integrated circuit, a connection terminal electrically connected to the semiconductor integrated circuit, a first insulating layer configured to expose a part of the connection terminal;

a second step of preparing a support body, and arranging the semiconductor device on one surface of the support body so that an exposed portion of the connection terminal, which is exposed from the first insulating layer, faces the one surface of the support body;

a third step of forming a second insulating layer on the one surface of the support body to fill at least a space portion adjoining each side surface of the semiconductor device arranged on the one surface of the support body;

a fourth step of removing the support body;

a fifth step of forming a first wiring pattern to be electrically connected to the exposed portion on a surface of each of the first insulating layer and the second insulating layer which are set so that the surface thereof is at the side of the exposed portion;

a sixth step of forming a first via-hole from which the first wiring pattern is exposed on the second insulating layer; and a seventh step of forming a second wiring pattern to be electrically connected via the first via-hole to the first wiring pattern on a surface of the second insulating layer, which is set so that the surface thereof is opposite to the exposed portion.

According to a second aspect of the invention, there is provided a manufacturing method for a semiconductor device embedded substrate, including:

a first step of preparing a semiconductor device that has a semiconductor integrated circuit, a connection terminal electrically connected to the semiconductor integrated circuit, a first insulating layer configured to expose a part of the connection terminal;

a second step of preparing a support body, and arranging the semiconductor device on one surface of the support body so that an exposed portion of the connection terminal, which is exposed from the first insulating layer, faces the one surface of the support body;

a third step of forming a second insulating layer on the one surface of the support body to fill at least a space portion adjoining each side surface of the semiconductor device arranged on the one surface of the support body;

a fourth step of removing the support body;

a fifth step of forming a first wiring pattern to be electrically connected to the exposed portion on a surface of each of the first insulating layer and the second insulating layer which are set so that the surface thereof is at the side of the exposed portion;

an eighth step of forming a third insulating layer on a surface of each of the semiconductor device and the second insulating layer, each of which is set so that the surface thereof is opposite to the exposed portion;

a ninth step of forming a first via-hole from which the first wiring pattern is exposed on the second insulating layer; and a tenth step of forming a second wiring pattern to be electrically connected via the first via-hole to the first wiring pattern on a surface of the second insulating layer, which is set so that the surface thereof is opposite to the exposed portion, wherein in the ninth step, the first via-hole, from which the first wiring pattern is exposed, is formed in each of the second insulating layer and the third insulating layer, and in the tenth step, the second wiring pattern to be electrically connected via the first via-hole to the first wiring pattern is formed on the third insulating layer.

According to a third aspect of the invention, there is provided the manufacturing method for a semiconductor device embedded substrate according to the first or second aspect, further including:

a ninth step of alternately forming an insulating layer and a wiring pattern so as to cover the first wiring pattern.

According to a forth aspect of the invention, there is provided the manufacturing method for a semiconductor device embedded substrate according to any one of the first to third aspects, further including:

a tenth step of alternately forming an insulating layer and a wiring pattern so as to cover the second wiring pattern.

According to a fifth aspect of the invention, there is provided the manufacturing method for a semiconductor device embedded substrate according to any one of the first to forth aspects, wherein the first step includes the steps of:

forming the connection terminal on an electrode pad formed on the semiconductor integrated circuit;

forming the first insulating layer on the semiconductor integrated circuit to cover the connection terminal;

providing a plate-like body on the first insulating layer, a surface of the plate-like body opposite to the first insulating layer, having a rough surface;

exposing a part of the connection terminal from the first insulating layer by attaching the rough surface of the plate-like body to the first insulating layer by pressure; and removing the plate-like body.

According to the disclosed manufacturing method, there can be provided a manufacturing method for a semiconductor device embedded substrate, which can suppress increase of the manufacturing cost thereof and extremely reduce the interval of connection terminals for electrically connecting a wiring pattern (rewiring-wire) to a semiconductor integrated circuit that the semiconductor device has.

DETAILED DESCRIPTION OF THE PREFERRED EMBODIMENTS

Figure 1:
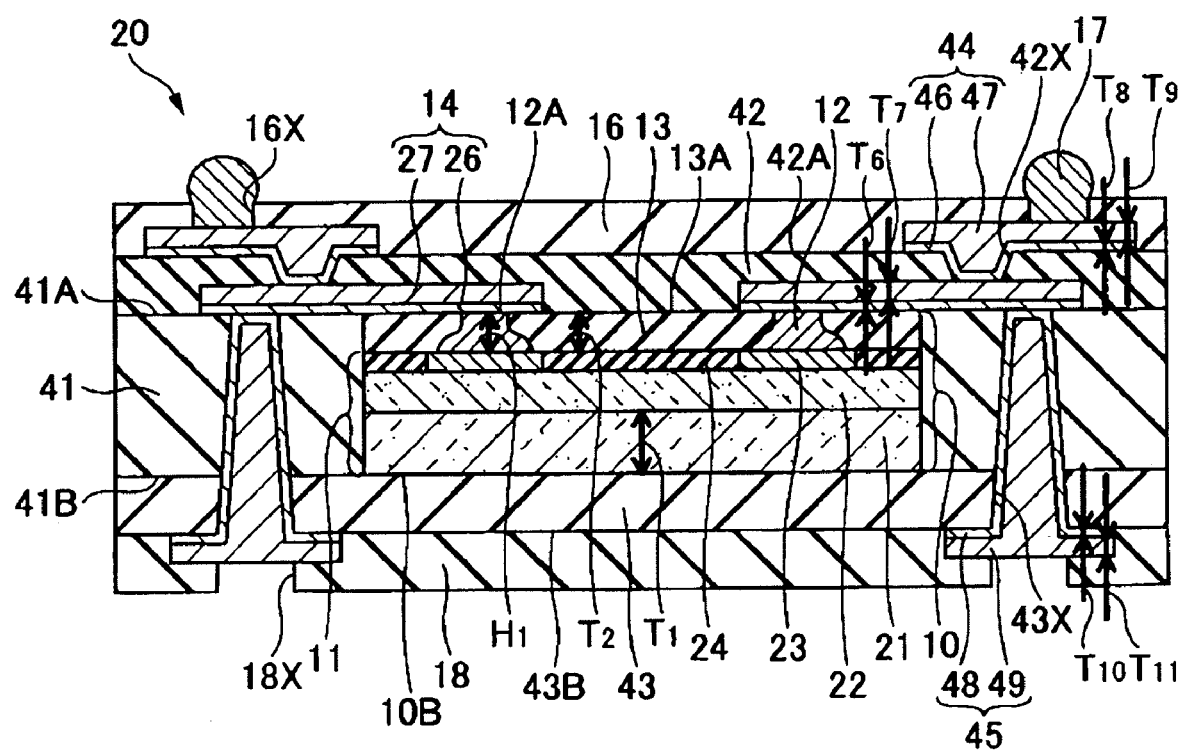
FIG. 1 is a sectional view of a semiconductor device embedded substrate according to the first embodiment of the present invention.

Hereinafter, a best mode for carrying out the invention is described by referring to the drawings.

First Embodiment

Structure of Semiconductor Device Embedded Substrate according to First Embodiment of the Invention First, the structure of a semiconductor device embedded substrate according to a first embodiment of the invention is described below. FIG. 1 is a cross-sectional view illustrating a semiconductor device embedded substrate according to the first embodiment of the invention. Referring to FIG. 1, a semiconductor device embedded substrate 20 includes a semiconductor device 10, wiring patterns 14, 44, 45, insulating layers 41, 42, 43, solder resist layers 16, 18, and an external connection terminal 17.

The semiconductor device 10 includes a semiconductor chip 11, a connection terminal 12, and an insulating layer 13. In the semiconductor device 10, the semiconductor chip 11 includes a semiconductor substrate 21, a semiconductor integrated circuit 22, a plurality of electrode pads 23, and a protection film 24. The semiconductor substrate 21 is a substrate for forming the semiconductor integrated circuit 22. The semiconductor substrate 21 is laminated. The thickness $T_1$ of the semiconductor substrate 21 can be set to range from, e.g., 50 μm to 500 μm. For example, the semiconductor substrate 21 is obtained by individualizing a laminated silicon (Si) wafer.

The semiconductor integrated circuit 22 is provided on one surface of the semiconductor substrate 21. The semiconductor integrated circuit 22 includes a diffusion layer (not shown) formed on the semiconductor substrate 21, an insulating layer (not shown) stacked on the semiconductor substrate 21, via-holes (not shown) provided in the stacked insulating layer (not shown), and wiring (not shown).

A plurality of electrode pads 23 are provided on the semiconductor integrated circuit 22. The plurality of electrode pads 23 are electrically connected to wiring (not shown) provided in the semiconductor integrated circuit 22.

For example, aluminum (Al) can be used as the material of the electrode pads 23. A material obtained by forming an Al-layer on a copper (Cu) layer, or a material obtained by forming a Si-layer on a Cu-layer and then forming an Al-layer on the Si-layer can be used.

The protection film 24 is provided on the semiconductor integrated circuit 22. The protection film 24 is a film for protecting the semiconductor integrated circuit 22. Sometimes, the protection film 24 is called "a passivation film". For example, a silicon nitride (SiN) film, and a phosphorous silicate glass (PSG) film can be used as the protection film 24. Alternatively, a material obtained by stacking a layer made of polyimide or the like on a layer formed of a SiN film, a PSG film or the like can be used as the protection film 24.

The connection terminal 12 is provided on the electrode pad 23. The connection terminal 12 has a shape having a projection portion. A surface 12A of the connection terminal 12 is exposed from a surface 13A of the insulating layer 13 and electrically connected to the wiring pattern 14. That is, the connection terminal 12 has a function of electrically connecting the wiring pattern 14 via the electrode pad 23 to the semiconductor integrated circuit 22 that the semiconductor device 10 has.

The height $H_1$ of the connection terminal 12 can be set to range, e.g., from 10 μm to 60 μm. For example, a gold (Au) bump, an Au-plated film, and a metal film constituted by a nickel (Ni)-film, which is formed by an electroless plating method, and a Au-film that covers the Ni-film can be used as the connection terminal 12. For example, the Au-bump can be formed by a bonding wire using a wire bonding apparatus. Alternatively, the Au-bump can be formed by a plating method.

The insulating layer 13 seal-protects a circuit formation surface (main surface) of the semiconductor chip 11 and serves as a part of a base material at the time of forming the wiring pattern 14. The insulating layer 13 is provided to cover the connection terminal 12, except for the surface 12A thereof, and the semiconductor chip 11. The surface 13A of the insulating layer 13 is set to be substantially flush with the surface 12A of the connection terminal 12.

Either of a photosensitive material and a non-photosensitive material can be used as the material of the insulating layer 13. For example, an adhesive sheet-like insulating resin (e.g., non-conductive film (NCF)) in a B-stage state (i.e., a semi-cured state), a paste-like insulating resin (e.g., a non-conductive paste (NCP)), an adhesive sheet-like anisotropic conductive resin (e.g., an anisotropic conductive film (ACF)), a paste-like anisotropic conductive resin (e.g., an anisotropic conductive paste (ACP)), a build-up resin (an epoxy resin containing a filler or an epoxy resin without a filler), and a liquid crystal polymer can be cited as the insulating layer 13. The ACP and the ACF are resins that are obtained by dispersing small-diameter spherically shaped resins coated with Ni/Au into an epoxy-based insulating resin, and that have an electrical-conductivity in a vertical direction and an electrical-insulation-property in a horizontal direction. The thickness $T_2$ of the insulating layer 13 can be set to range, e.g., from 10 μm to 60 μm The insulating layer 41 is provided to fill a space portion adjoining each side surface of the semiconductor device 10. The insulating layer 41 is a part of the base material when the wiring pattern 14 is formed. Resin materials, such as an epoxy-based resin and a polyimide-based resin, can be used as the material of the insulating layer 41.

The wiring pattern 14 is provided on a surface 13A of the insulating layer 13 and a surface 41A of the insulating layer 41 so as to be contacted with a surface 12A of the connection terminal 12. The wiring pattern 14 is electrically connected to a semiconductor integrated circuit 22 via the connection terminal 12 and the electrode pad 23. The wiring pattern 14 is also electrically connected to the wiring pattern 44 and the wiring pattern 45 via a via-hole 42X and another via-hole 43X, respectively. The wiring pattern 14 is sometimes called what is called a rewiring-wire. The wiring pattern 14 is provided to differentiate the position of the electrode pad 23 from that of an external connection terminal (so as to perform what is called a "fan-out" and the arrangement of terminals at given locations, i.e., what is called a pitch conversion).

The wiring pattern 14 includes metal layers 26, 27. For example, a layered body including a Cu-layer, another Cu-layer and a chromium (Cr) layer, and a layered body including Cu-layer and a titanium (Ti) layer can be used as the metal layer 26. Alternatively, an electroless Cu-plating layer can be used as the metal layer 26. Further alternatively, a metal thin film layer formed by a vapor-deposition method, a coating method, or a chemical vapor deposition (CVD) method can be used as the metal layer 26. Alternatively, a metal thin film layer formed by a combination of the aforementioned methods of forming a metal layer can be used as the metal layer 26. The thickness $T_6$ of the metal layer 26 can be set at, e.g., 2 μm. For example, a Cu-layer can be used as the metal layer 27. The thickness $T_7$ of the metal layer 27 can be set at, e.g., 10 μm.

The insulating layer 42 is provided on the surface 13A of the insulating layer 13 and the surface 41A of the insulating layer 41 to cover the wiring pattern 14. Resin materials, such as an epoxy-based resin and a polyimide-based resin, can be used as the material of the insulating layer 42. The wiring pattern 44 is provided on the surface 42A of the insulating layer 42. The wiring pattern 44 is electrically connected to the wiring pattern 14 via the via-hole 42X formed in the insulating layer 42.

The wiring pattern 44 includes metal layers 46, 47. For example, a layered body including a Cu-layer, another Cu-layer and a Cr-layer, and a layered body including Cu-layer and a Ti-layer can be used as the metal layer 46. Alternatively, an electroless Cu-plating layer can be used as the metal layer 46. Further alternatively, a metal thin film layer formed by a vapor-deposition method, a coating method, or a chemical vapor deposition (CVD) method can be used as the metal layer 46. Alternatively, a metal thin film layer formed by a combination of the aforementioned methods of forming a metal layer can be used as the metal layer 46. The thickness $T_8$ of the metal layer 46 can be set at, e.g., 2 μm. For example, a Cu-layer can be used as the metal layer 47. The thickness $T_9$ of the metal layer 47 can be set at, e.g., 10 μm.

The solder resist layer 16 is provided on a surface 42A of the insulating layer 42 to cover the wiring pattern 44. The solder resist layer 16 has an opening portion 16X from which a part of the wiring pattern 44 is exposed. The material of the solder resist layer 16 is, e.g., a photosensitive resin composition.

The insulating layer 43 is provided under a surface 41B of the insulating layer 41 and a rear surface portion 10B of the semiconductor device 10. An epoxy-based resin, a polyimide-based resin, and the like can be used as the material of the insulating layer 43. The wiring pattern 45 is provided under a surface 43B of the insulating layer 43. The wiring pattern 45 is electrically connected to the wiring pattern 14 via the via-hole 43X formed in the insulating layers 41 and 43.

The wiring pattern 45 includes metal layers 48, 49. For example, a layered body including a Cu-layer, another Cu-layer and a Cr-layer, and a layered body including Cu-layer and a Ti-layer can be used as the metal layer 48. Alternatively, an electroless Cu-plating layer can be used as the metal layer 48. Further alternatively, a metal thin film layer formed by a vapor-deposition method, a coating method, or a chemical vapor deposition (CVD) method can be used as the metal layer 48. Alternatively, a metal thin film layer formed by a combination of the aforementioned methods of forming a metal layer can be used as the metal layer 48. The thickness $T_{10}$ of the metal layer 48 can be set at, e.g., 2 μm. For example, a Cu-layer can be used as the metal layer 49. The thickness $T_{11}$ of the metal layer 49 can be set at, e.g., 10 μm.

The solder resist layer 18 is provided under a surface 43B of the insulating layer 43 to cover the wiring pattern 45. The solder resist layer 18 has an opening portion 18X from which a part of the wiring pattern 45 is exposed. The material of the solder resist layer 18 is, e.g., a photosensitive resin composition.

The external connection terminal 17 is provided on the wiring pattern 44 exposed into the opening portion 16X of the solder resist layer 16 and/or on the wiring pattern 45 exposed into the opening portion 18X of the solder resist layer 18.

The external connection terminal 17 is a terminal to be electrically connected to the pad provided on a mounting substrate (not shown), e.g., a motherboard. For example, a solder bump can be used as the external connection terminal 17. For example, an alloy including Pb, an alloy of tin (Sn) and Cu, an alloy including Sn and silver (Ag), and an alloy including Sn, Ag, and Cu can be used as the material of the external connection terminal 17. Alternatively, a solder ball (Sn-3.5Ag), which uses a resin (e.g., divinylbenzene) as a core, can be used as the material of the external connection terminal 17.

The above is the structure of the semiconductor device embedded substrate according to the first embodiment of the invention.

Manufacturing Method for Semiconductor Device Embedded Substrate according to First Embodiment of the Invention Next, a manufacturing method for a semiconductor device embedded substrate according to the first embodiment of the invention is described below. FIGS. 2 to 21 exemplify a process of manufacturing a semiconductor device embedded substrate according to the first embodiment of the invention. In FIGS. 2 to 21, the same components as those of the semiconductor device embedded substrate 20 illustrated in FIG. 1 are designated with the same reference characters. The description of some of such components is omitted. In FIGS. to 11, reference character "C" designates a position (hereinafter referred to as a "substrate cutting position C"), at which a dicing blade cuts the semiconductor substrate 31.

Reference character "A" denotes a plurality of semiconductor device formation regions (hereinafter referred to as "semiconductor device formation regions A"). Reference character "B" represents a scribe region (hereinafter referred to as a "scribe region B") including a substrate cutting position C for separating the plurality of semiconductor device formation regions A.

Figure 2:
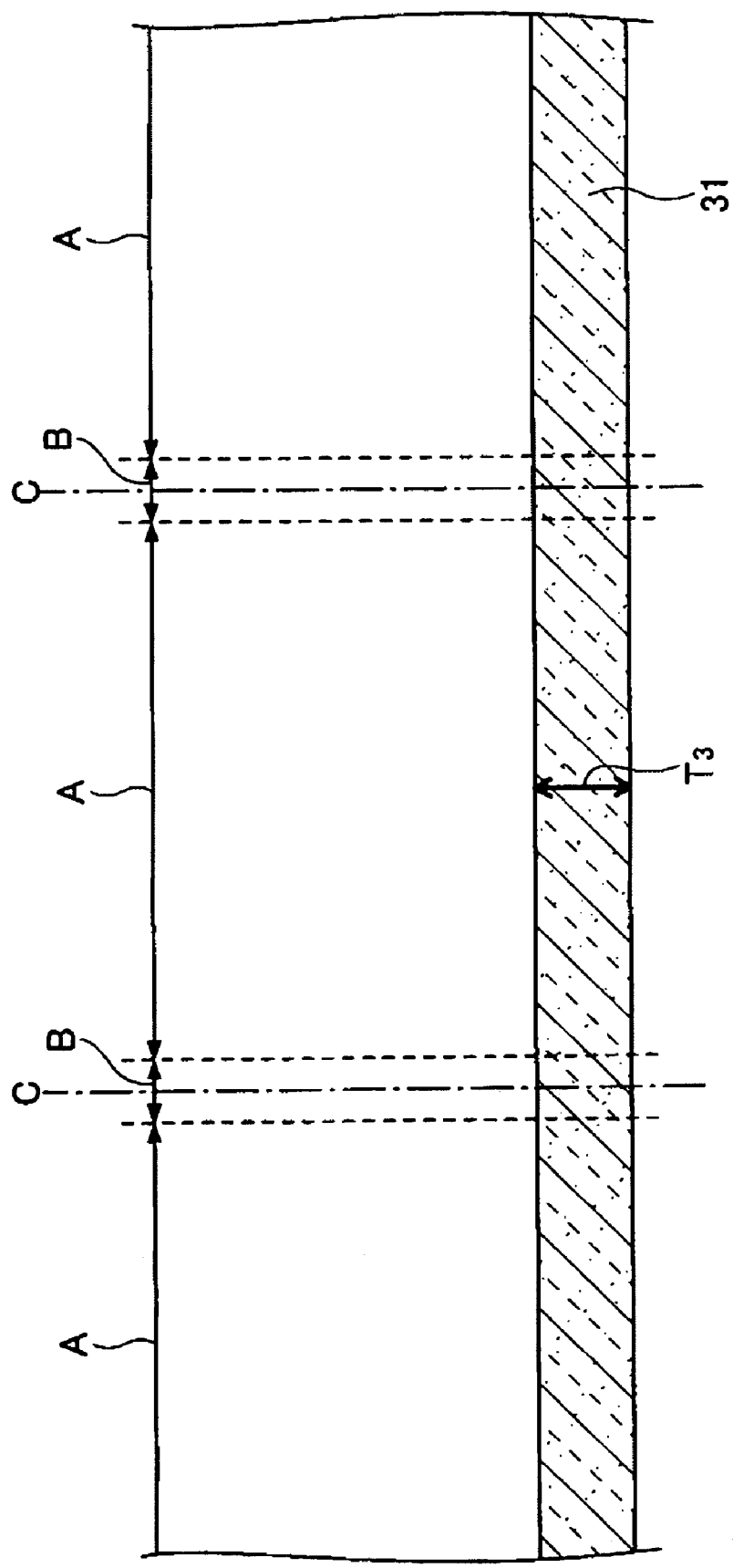
FIG. 2 is an illustration (No. 1)showing a manufacturing method for a semiconductor device embedded substrate according to the first embodiment of the present invention.
Figure 3:
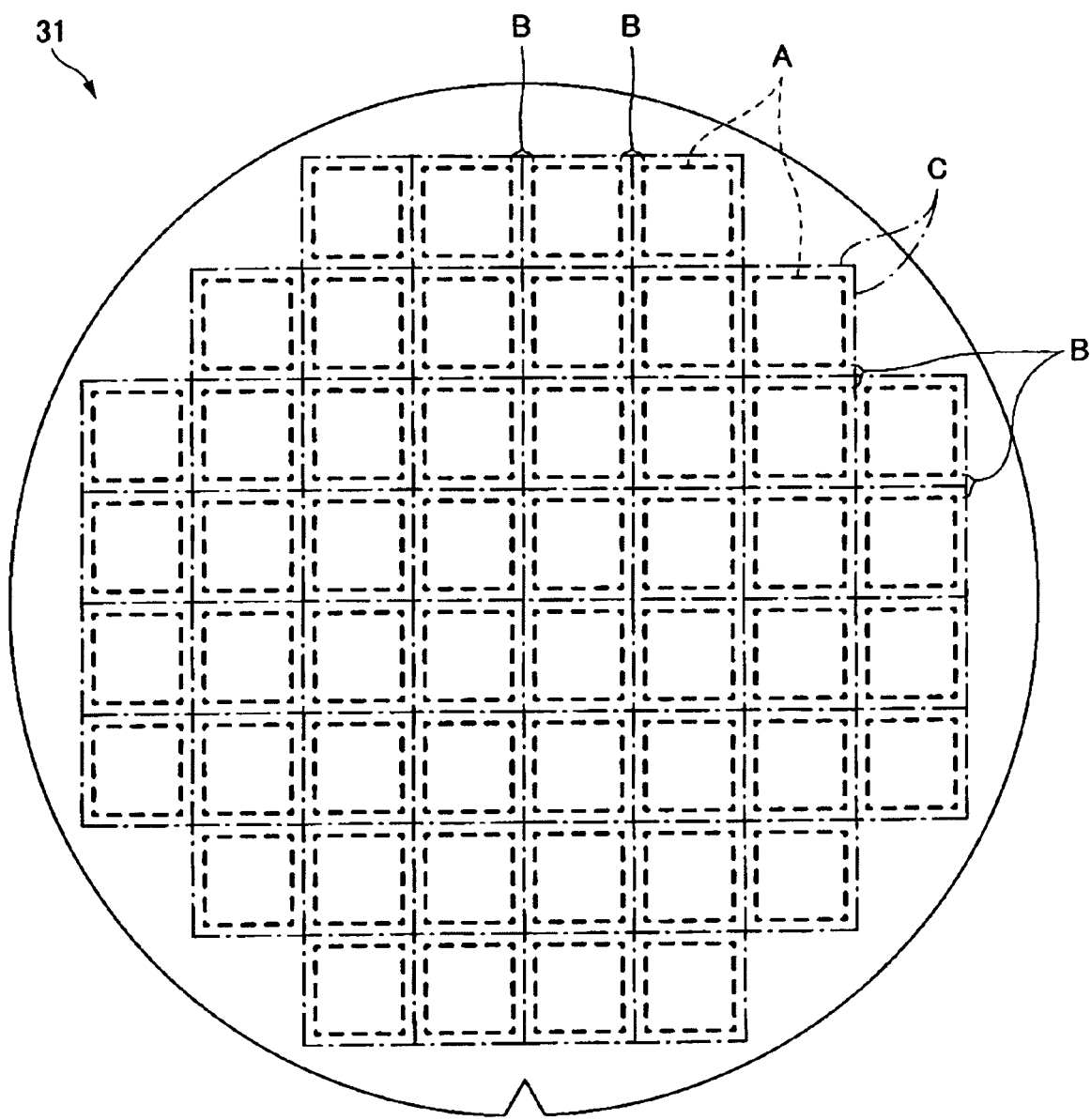
FIG. 3 is an illustration (No. 2)showing a manufacturing method for a semiconductor device embedded substrate according to the first embodiment of the present invention.

First, in steps respectively illustrated in FIGS. 2 and 3, a semiconductor substrate 31 is prepared, which has a plurality of semiconductor device formation regions A and a scribe region B including a substrate cutting position C for separating a plurality of semiconductor device formation regions A from one another. FIG. 2 is a cross-sectional view exemplifying a semiconductor substrate. FIG. 3 is a plan view exemplifying the semiconductor substrate. The semiconductor substrate 31 illustrated in FIGS. 2 and 3 is laminated, and cut at the substrate cutting positions C. Thus, the semiconductor substrate 31 is formed into the aforementioned semiconductor substrate 21 (see FIG. 1). For example, a Si-wafer can be used as the semiconductor substrate 31. The thickness $T_3$ of the semiconductor substrate 31 can be set to range, e.g., from 500 μm to 775 μm.

Figure 4:
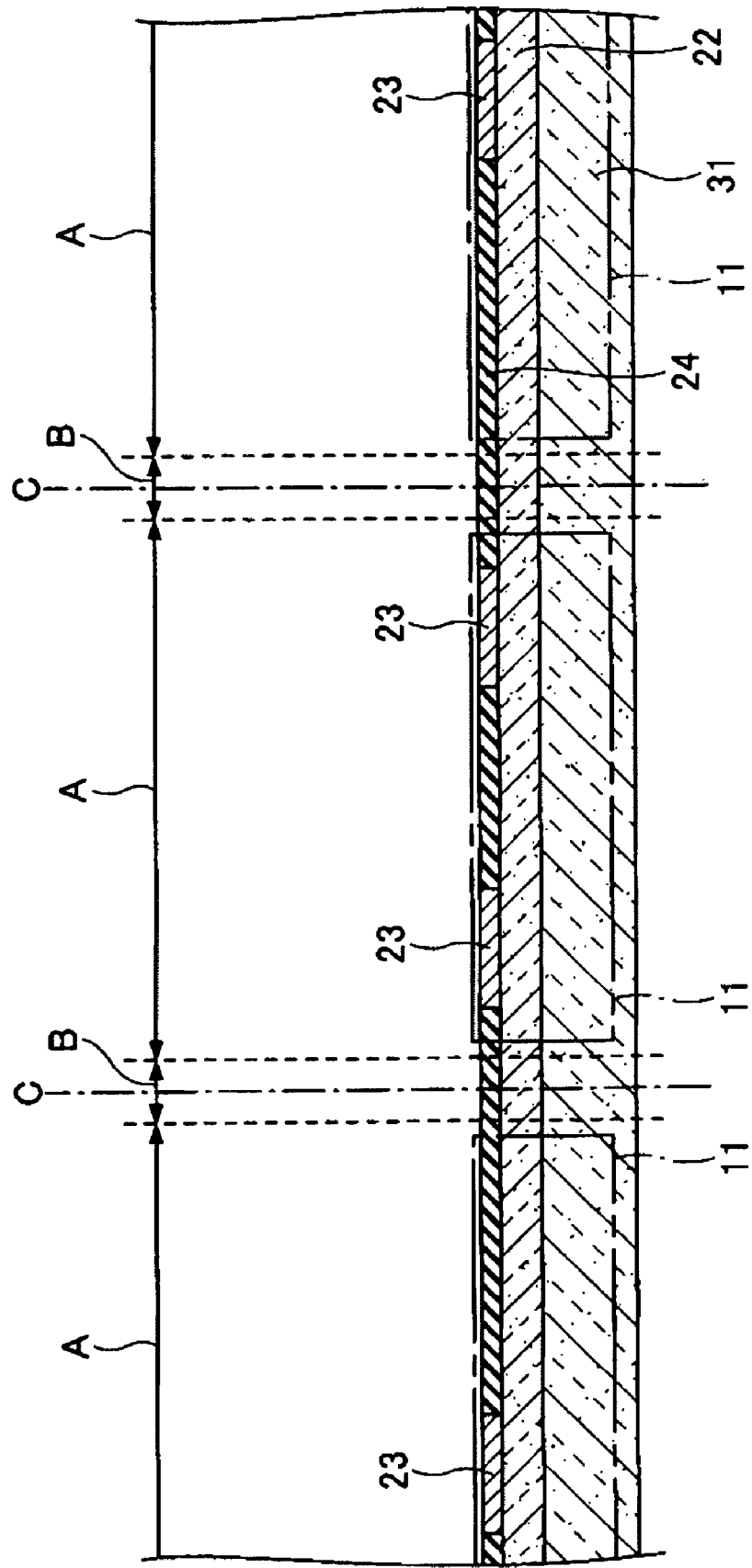
FIG. 4 is an illustration (No. 3)showing a manufacturing method for a semiconductor device embedded substrate according to the first embodiment of the present invention.

Next, in a step illustrated in FIG. 4, the semiconductor chip 11 having the semiconductor integrated circuit 22, the electrode pad 23, and the protection film 24 is formed in one of the surface portions of the semiconductor substrate 31, which corresponds to each of the semiconductor device formation regions A. For example, Al can be used as the material of each of the electrode pads 23. A material obtained by forming an Al-layer on a Cu-layer, a material obtained by forming a Si-layer on a Cu-layer and then forming an Al-layer thereon can be used as the material of each of the electrode pads 23. For example, a SiN-film and a PSG-film can be used as the protection film 24. Alternatively, a layer including a polyimide layer can be stacked on a layer including a SiN-film and a PSG-film.

Figure 5:
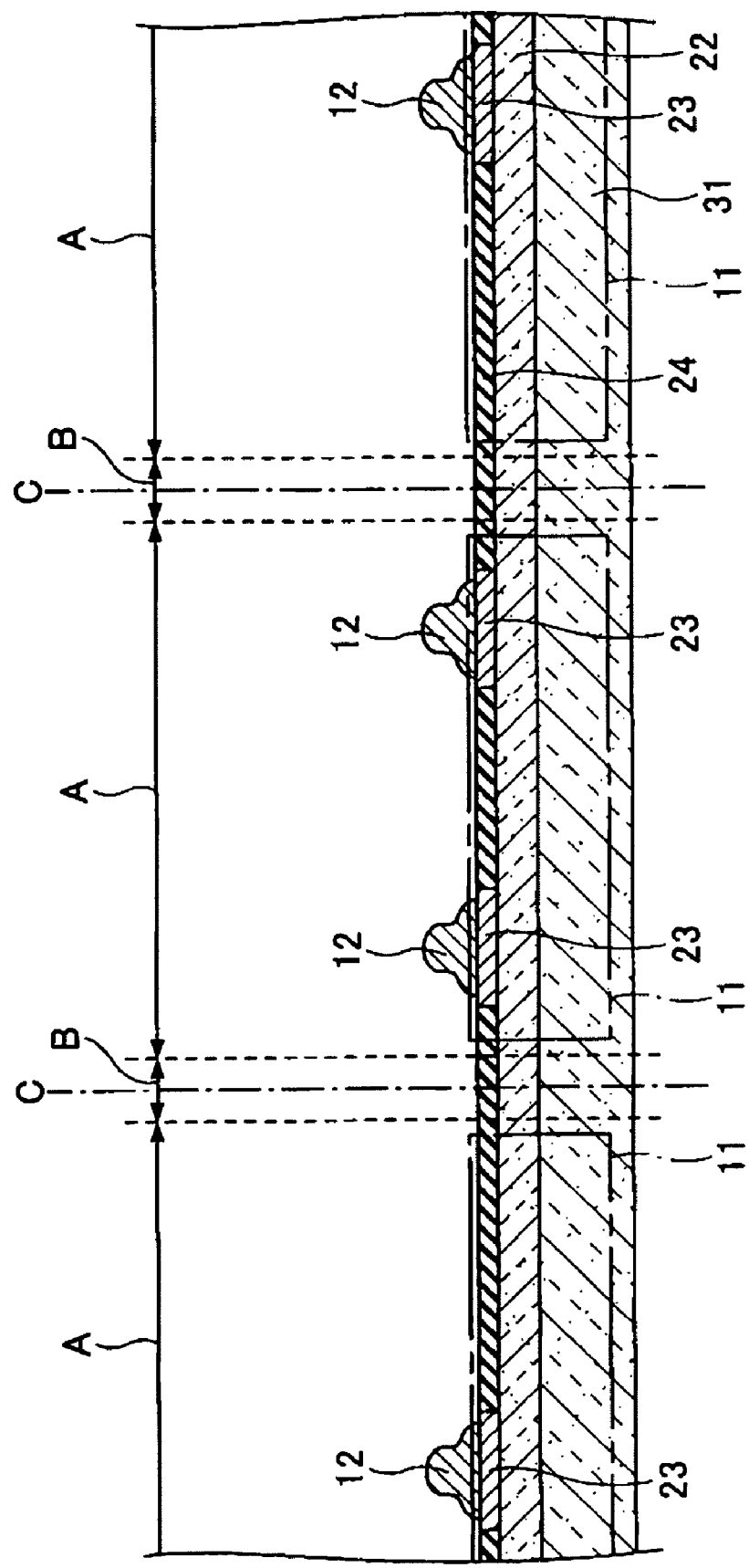
FIG. 5 is an illustration (No. 4)showing a manufacturing method for a semiconductor device embedded substrate according to the first embodiment of the present invention.

Next, in a step illustrated in FIG. 5, the connection. terminals 12 are formed on the plurality of electrode pads 23 provided in the semiconductor device formation regions A, respectively. For example, Au-bumps, Au-plating films, and metal films including a Ni-film formed by an electrolytic plating method or what is called an Al-zincate method and an Au-film stacked on the Ni-film can be used as the connection terminals 12. The Au-bump can be formed of a bonding wire using a wire bonding apparatus. Alternatively, the Au-bump can be formed by a plating method. There is variation in height among the plurality of connection terminals 12 formed in the step illustrated in FIG. 5.

Figure 6:
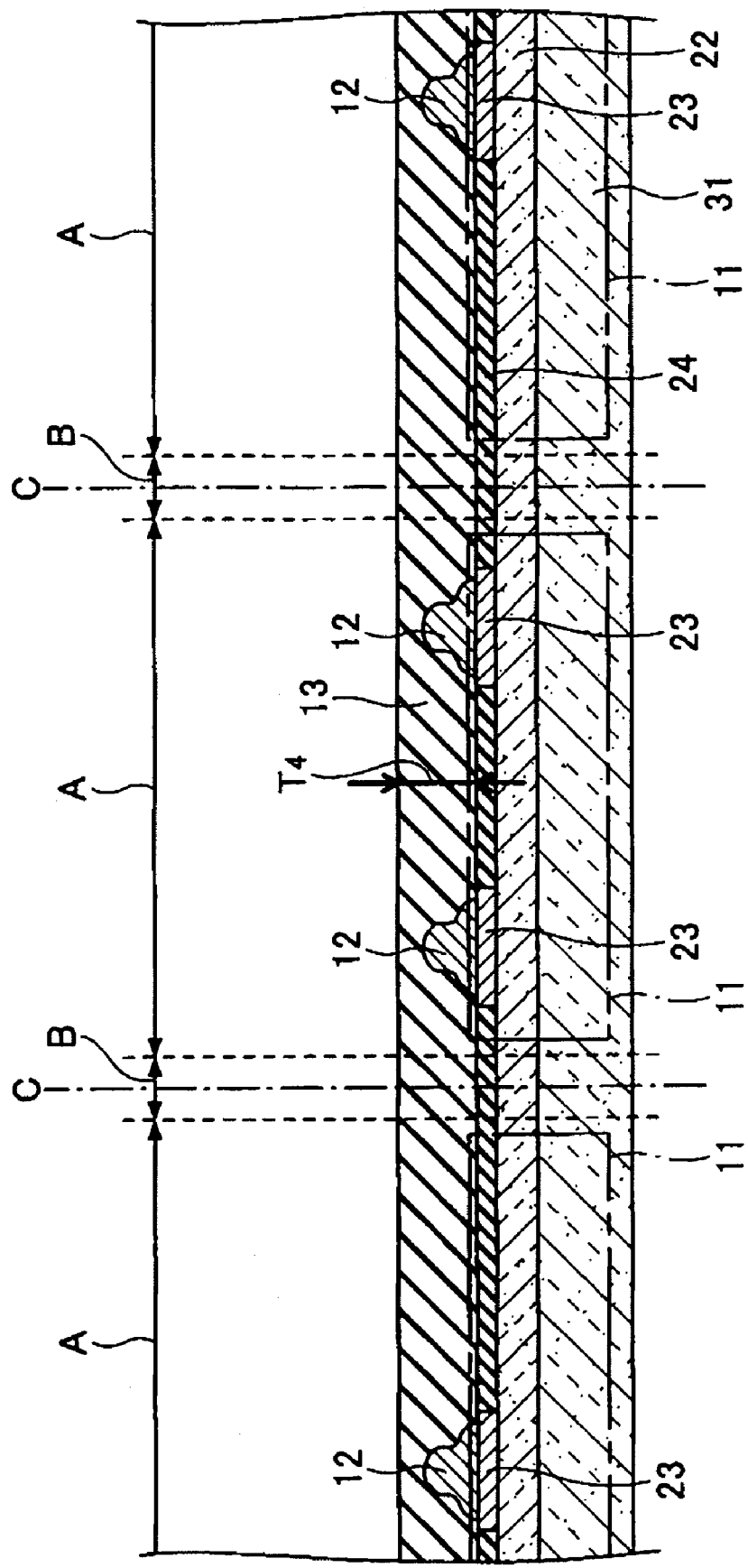
FIG. 6 is an illustration (No. 5)showing a manufacturing method for a semiconductor device embedded substrate according to the first embodiment of the present invention.

Next, in a step illustrated in FIG. 6, the insulating layer 13 is formed to cover a plurality of semiconductor chips 11 formed on a side, on which the connection terminals 12 are provided, and the connection terminals 12. Either of a photosensitive material and a non-photosensitive material can be used as the material of the insulating layer 13. For example, an adhesive sheet-like insulating resin (e.g., non-conductive film (NCF)) in a B-stage state (i.e., a semi-cured state), a paste-like insulating resin (e.g., a non-conductive paste (NCP)), an adhesive sheet-like anisotropic conductive resin (e.g., an anisotropic conductive film (ACF)), a paste-like anisotropic conductive resin (e.g., an anisotropic conductive paste (ACP)), a build-up resin (an epoxy resin containing a filler or an epoxy resin without a filler), and a liquid crystal polymer can be cited as the insulating layer 13. The ACP and the ACF are the resins that are obtained by dispersing small-diameter spherically shaped resins coated with Ni/Au into an epoxy-based insulating resin, and that have an electrical-conductivity in a vertical direction and an electrical-insulation-property in a horizontal direction.

In the case of using an adhesive sheet-like insulating resin as the insulating layer 13, the sheet-like insulating resin is attached to one surface side of a structure illustrated in FIG. 5. On the other hand, in the case of using a paste-like insulating resin as the insulating layer 13, the paste-like insulating resin is formed on one surface side of the structure illustrated in FIG. 5 by a print method. Subsequently, the insulating resin is semi-cured by being prebaked. The semi-cured insulating resin has adhesiveness. The thickness $T_4$ of the insulating layer 13 can be set to range, e.g., from 20 μm to 100 μm.

Figure 7:
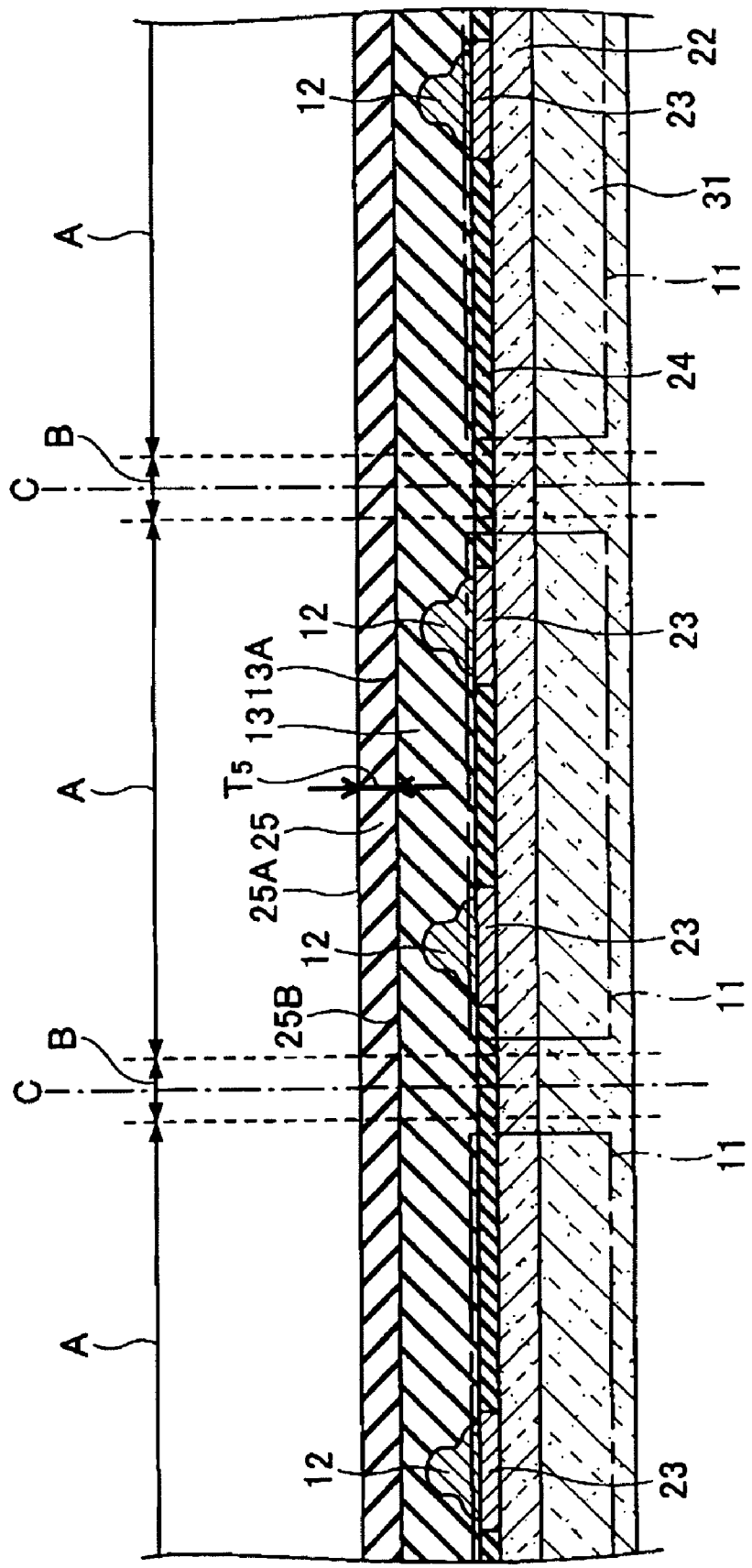
FIG. 7 is an illustration (No. 6)showing a manufacturing method for a semiconductor device embedded substrate according to the first embodiment of the present invention.

Next, in a step illustrated in FIG. 7, a plate-like body 25 is provided on a surface 13A of the insulating layer 13. The plate-like body 25 is such that a surface 25B thereof, which faces the surface 13A of the insulating layer 13, is a rough surface. The thickness $T_5$ of the plate-like body 25 can be set at, e.g., 10 μm. For example, a metal foil, e.g., a Cu-foil can be used as the plate-like body 25. Alternatively, a temporary film formed of a polyethylene-terephtalate (PET) can be used as the plate-like body 25. Further, a resin film with single side copper foil, in which copper foil is previously provided on the single side of the resin film can be used. Hereinafter, the following steps are described below by taking, as an example, the case of using a metal foil as the plate-like body 25.

Figure 8:
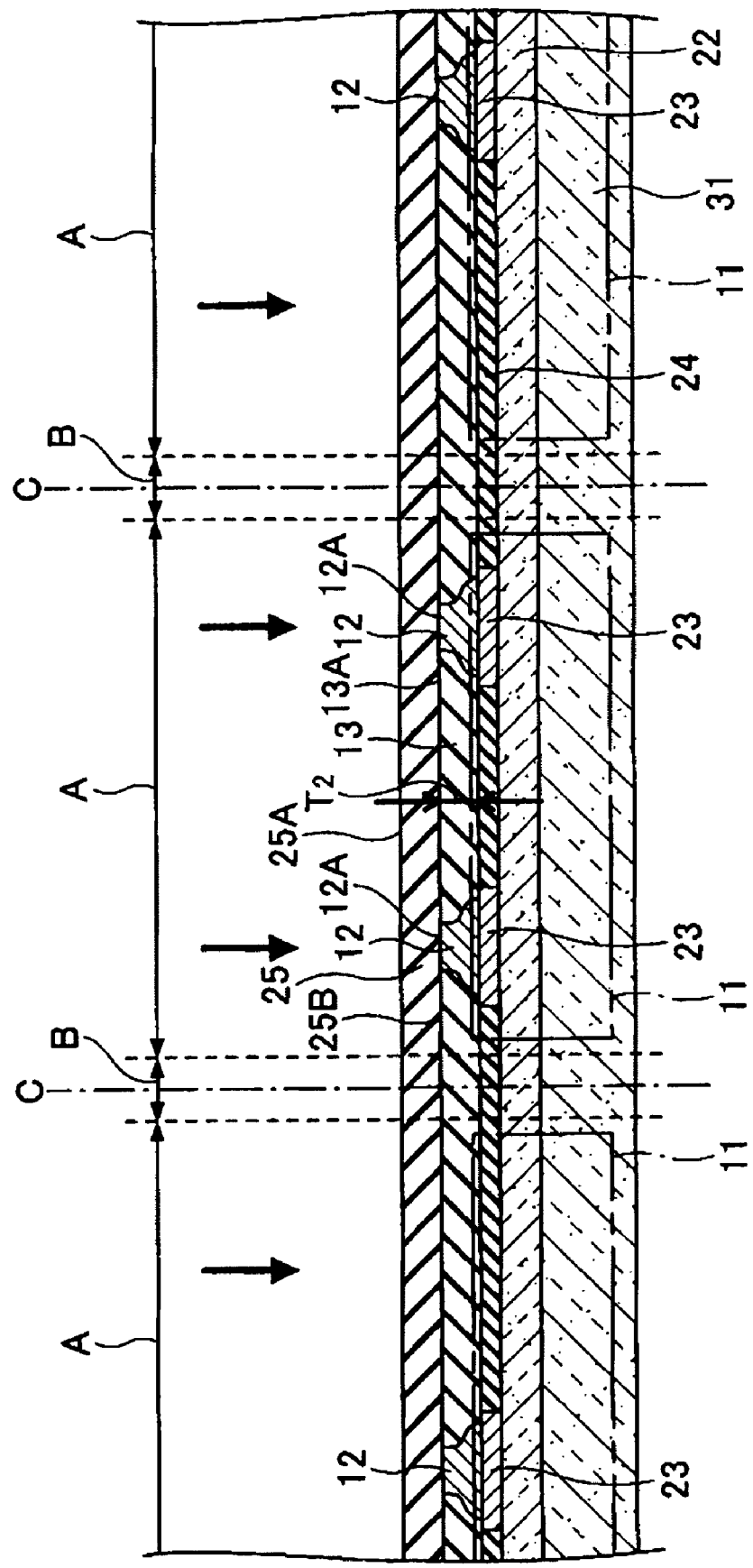
FIG. 8 is an illustration (No. 7)showing a manufacturing method for a semiconductor device embedded substrate according to the first embodiment of the present invention.

Next, in a step illustrated in FIG. 8, in a state in which a structure illustrated in FIG. 7 is heated, the plate-like body 25 is pushed from the side of a surface 25A of the plate-like body 25 so as to be attached to the insulating layer 13 by pressure. Consequently, the insulating layer 13 is pressed, so that the surface 12A of the connection terminal 12 is exposed from the surface 13A of the insulating layer 13. In addition, the rough surface, i.e., the surface 25B of the plate-like body 25 is transferred onto the surface 13A of the insulating layer 13. The insulating layer 13 is hardened by heating the structure illustrated in FIG. 7. The thickness $T_2$ of the insulating layer 13 after attaching the plate-like body 25 thereto by pressure can be set to range, e.g., from 10 μm to 60 μm.

Figure 9:
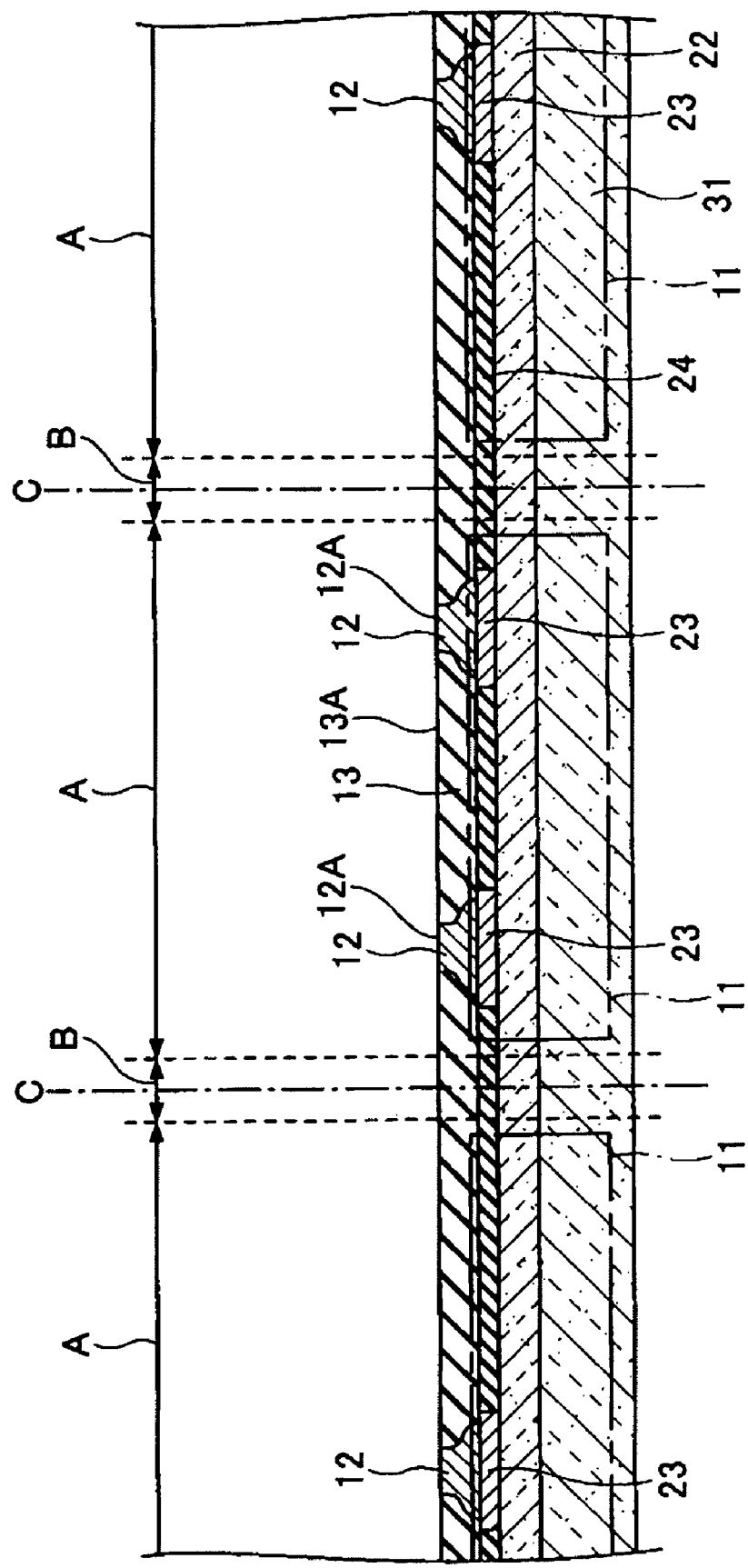
FIG. 9 is an illustration (No. 8)showing a manufacturing method for a semiconductor device embedded substrate according to the first embodiment of the present invention.

Next, in a step illustrated in FIG. 9, the entire plate-like body 25 is removed by etching or the like. As a result of performing processing in the steps respectively illustrated in FIGS. 7 to 9, the adhesiveness between the metal layer 26 and the connection terminal 12 can be enhanced in a step which is described below and illustrated in FIG. 15.

Figure 10:
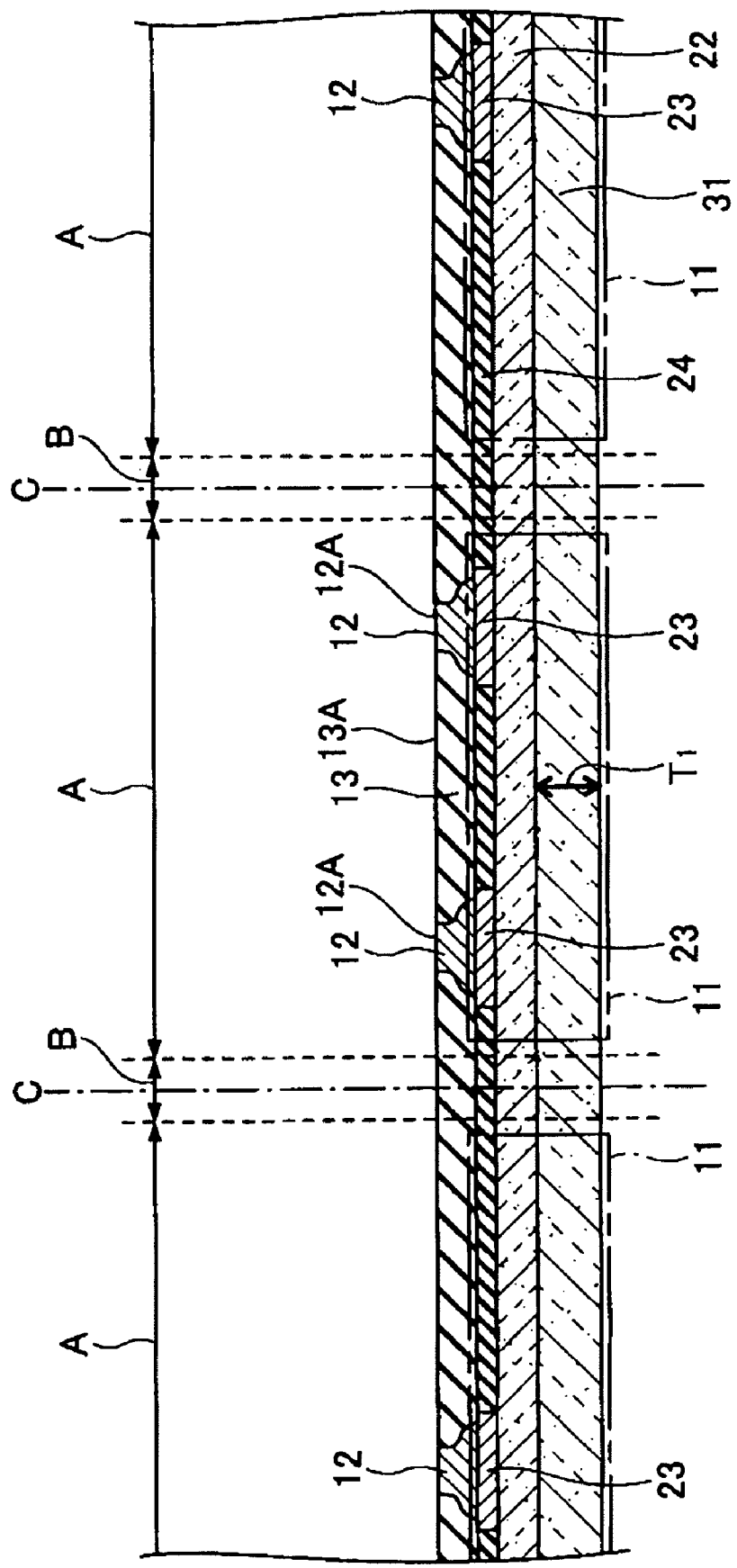
FIG. 10 is an illustration (No. 9)showing a manufacturing method for a semiconductor device embedded substrate according to the first embodiment of the present invention.

Next, in a step illustrated in FIG. 10, the semiconductor substrate 31 is polished or grounded from the side of the rear surface of the semiconductor substrate 31. Thus, the semiconductor substrate 31 is laminated. For example, a back-side grinder or the like is used for the lamination of the semiconductor substrate 31. The thickness $T_1$ of the laminated semiconductor substrate 31 can be set to range, e.g., from 50 μm to 500 μm. Sometimes, the step illustrated in FIG. 10 is eliminated.

Figure 11:
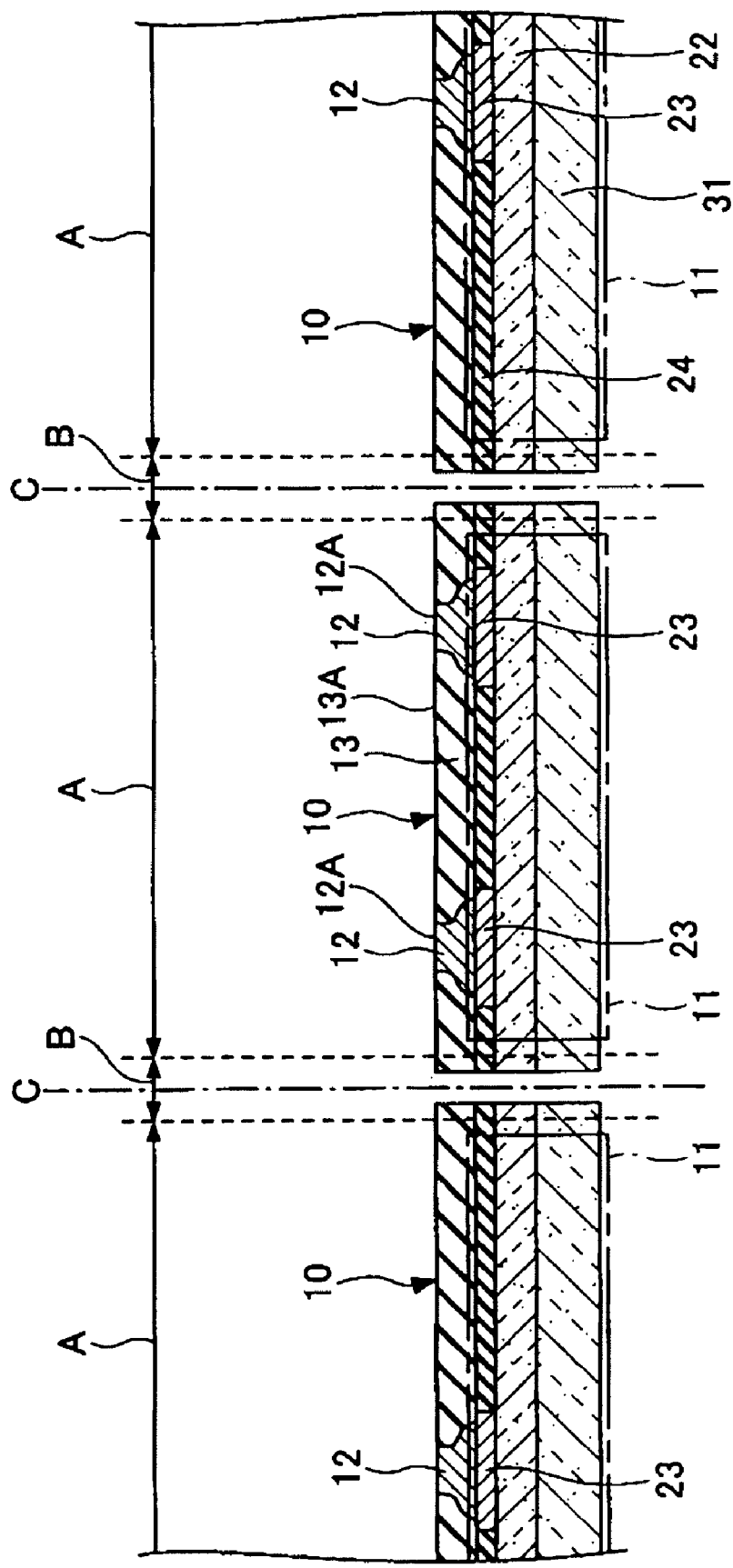
FIG. 11 is an illustration (No. 10)showing a manufacturing method for a semiconductor device embedded substrate according to the first embodiment of the present invention.

Next, in a step illustrated in FIG. 11, the semiconductor substrate 31 corresponding to the scribe region B is cut along the substrate cutting positions C. Thus, a plurality of semiconductor devices 10 are manufactured. The cutting of the semiconductor substrates 31 is performed by, e.g., dicing.

Figure 12:
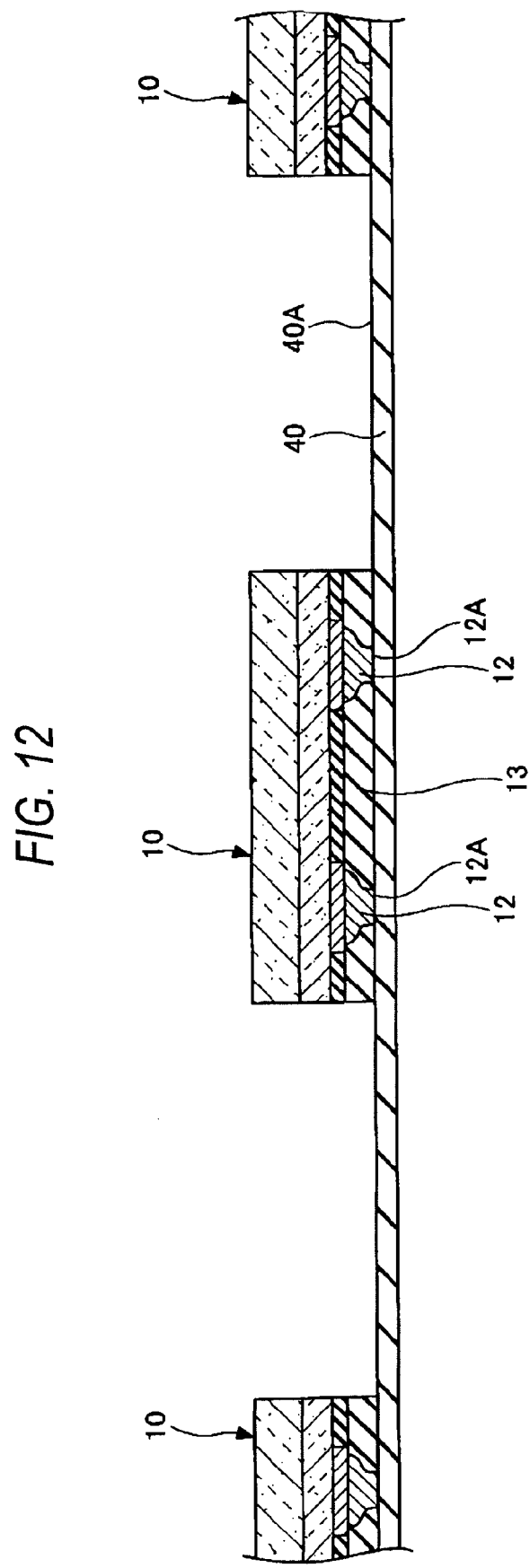
FIG. 12 is an illustration (No. 11)showing a manufacturing method for a semiconductor device embedded substrate according to the first embodiment of the present invention.

Next, in a step illustrated in FIG. 12, a support body 40 is prepared. Then, a plurality of semiconductor devices 10 are arranged on a surface 40A of the support body 40 such that the surface 12A of the connection terminal 12 faces the surface 40A of the support body 40. The surface 40A of the support body 40 has, e.g., adhesiveness. The arranged semiconductor devices 10 are fixed. Ina case where the surface 40A of the support body 40 does not have adhesiveness, the arranged semiconductor devices 10 are fixed by, e.g., an adhesion tape. For example, a PET film, a polyimide film, a metal plate, and a glass plate can be used as the support body 40.

Figure 13:
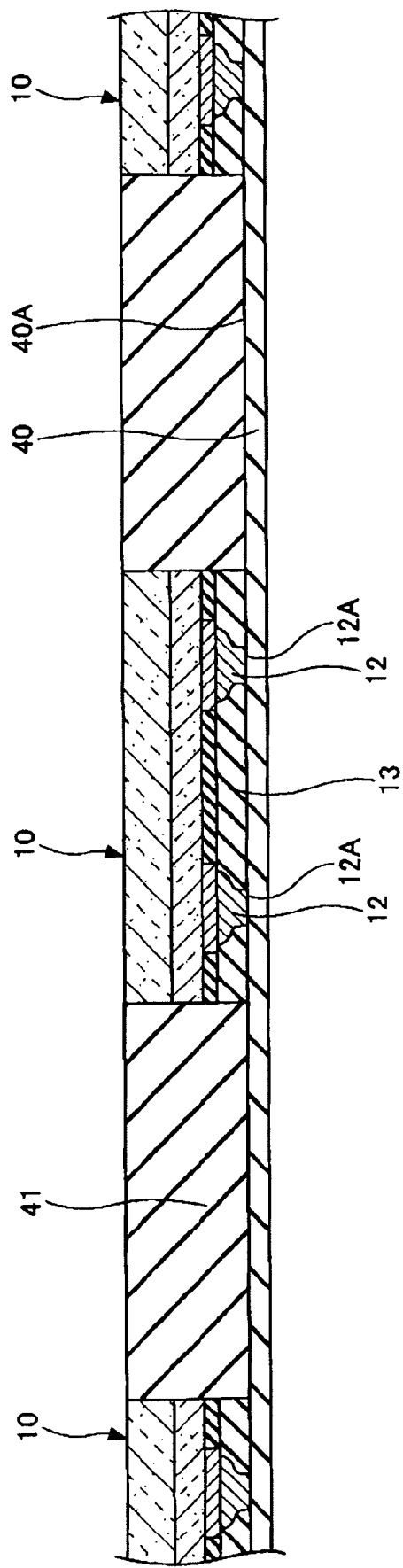
FIG. 13 is an illustration (No. 12)showing a manufacturing method for a semiconductor device embedded substrate according to the first embodiment of the present invention.
Figure 14:
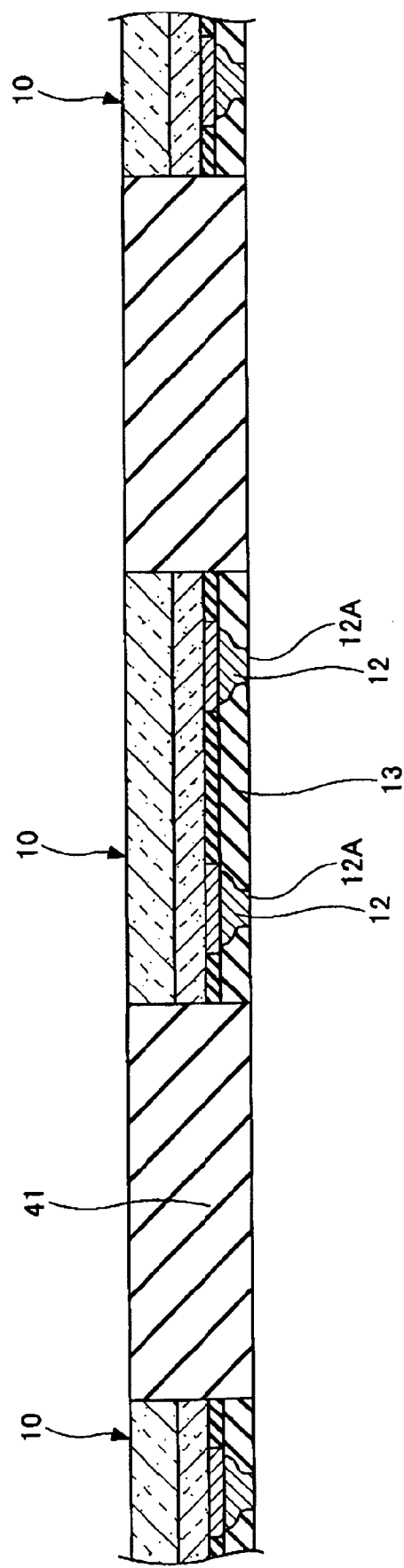
FIG. 14 is an illustration (No. 13)showing a manufacturing method for a semiconductor device embedded substrate according to the first embodiment of the present invention.

Next, in a step illustrated in FIG. 13, the insulating layer 41 is formed on the surface 40A of the support body 40 to fill at least a space portion between opposed side surfaces of the adjacent semiconductor devices 10. Resin materials, such as an epoxy-based resin and a polyimide-based resin, can be used as the material of the insulating layer 41. An example of a method of forming the insulating layer 41 is as follows.

First, a resin film made of an epoxy-based resin, a polyimide-based resin, or the like is laminated onto the surface 40A of the support body 40. Subsequently, the resin film is pressed (pushed). Then, the resin film is hardened by being subjected to a heat treatment at a temperature of, e.g., about 190° C. Thus, the insulating layer 41 can be obtained. Alternatively, first, a liquid resin, such as an epoxy-based resin or a polyimide-based resin, is applied onto the surface 40A of the support body 40. Subsequently, the liquid resin is hardened by being subjected to a heat treatment at a temperature of, e.g., about 190° C. Thus, the insulating layer 41 can be obtained. Next, in a step illustrated in FIG. 14, the support body 40 illustrated in FIG. 13 is eliminated.

Figure 15:
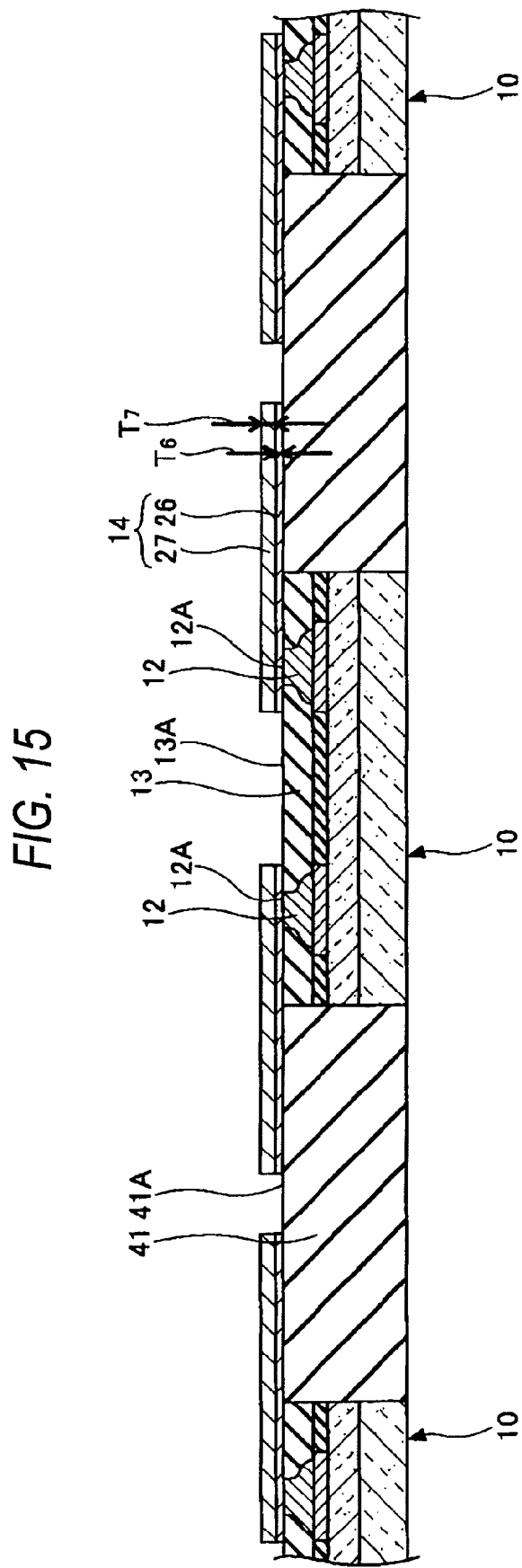
FIG. 15 is an illustration (No. 14)showing a manufacturing method for a semiconductor device embedded substrate according to the first embodiment of the present invention.

Next, in a step illustrated in FIG. 15, each wiring pattern 14 having the metal layer 26 and the metal layer 27 is formed on the surface 13A of the insulating layer 13 and the surface 41A of the insulating layer 41 so as to be contacted with the surface 12A of the connection terminal 12. Each wiring pattern 14 is electrically connected to the semiconductor integrated circuit 22 via the connection terminal 12 and the electrode pad 23. The thickness of the wiring pattern 14 can be set at, e.g., 12 μm.

More specifically, the wiring pattern 14 is formed as follows. First, each metal layer 26 is formed the surface 13A of the insulating layer 13 and the surface 41A of the insulating layer 41 by a sputtering method or the like. Each metal layer 26 and the connection terminal 12 are electrically connected to each other. For example, a layered body including a Cu-layer, another Cu-layer and a Cr-layer, and a layered body including Cu-layer and a Ti-layer can be used as the metal layer 26. Alternatively, an electroless Cu-plating layer can be used as the metal layer 26. Further alternatively, a metal thin film layer formed by a vapor-deposition method, a coating method, or a chemical vapor deposition (CVD) method can be used as the metal layer 26. Alternatively, a metal thin film layer formed by a combination of the aforementioned methods of forming a metal layer can be used as the metal layer 26. The thickness $T_6$ of the metal layer 26 can be set at, e.g., 2 μm.

Next, each metal layer 27 is formed by an electrolytic plating method using the metal layer 26 as an electrical-power feeding layer so as to cover the surface of the metal layer 26. For example, a Cu-layer can be used as the metal layer 27. The thickness $T_7$ of the metal layer 27 can be set at, e.g., 10 μ. Then, resist is applied onto the surface of the metal layer 27. This resist is exposed and developed by a photolithography method. Thus, a resist film is formed on the top portion of the metal layer 27, which corresponds to a region in which the wiring pattern 14 is formed.

Next, the metal layer 26 and the metal layer 27 are etched using the resist films as masks. Thus, a part of the metal layer 26 and the metal layer 27, which corresponds to a portion on which no resist film is formed, is removed to thereby form the wiring pattern 14. Subsequently, the resist film is removed. Then, the roughening of the wiring pattern 14 is performed. The roughening of the wiring pattern 14 can be performed by a method, such as a blackening method or a roughening etching method. The roughening aims at enhancement of the adhesiveness between the wiring pattern 14 and the insulating layer 42 formed on each of the top surface and the side surface of the wiring pattern 14.

Figure 16:
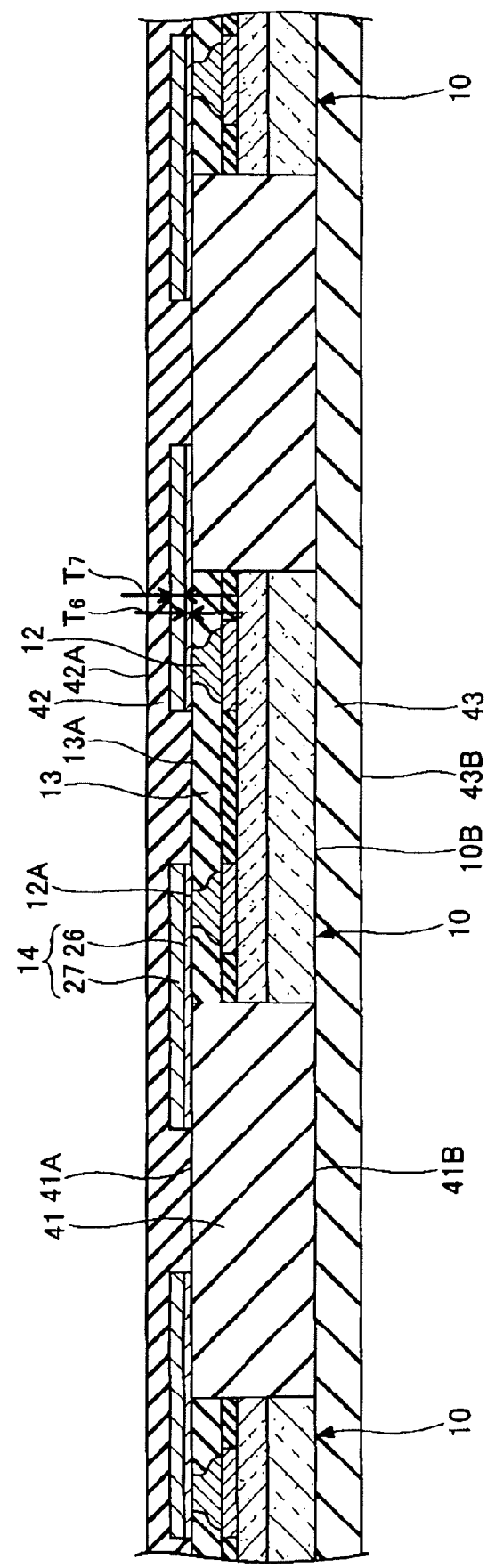
FIG. 16 is an illustration (No. 15)showing a manufacturing method for a semiconductor device embedded substrate according to the first embodiment of the present invention.

Next, in a step illustrated in FIG. 16, the insulating layer 42 is formed on the surface 13A of the insulating layer 13 and the surface 41A of the insulating layer 41 so as to cover the wiring pattern 14 shown in FIG. 15. In addition, the insulating layer 43 is formed to cover the rear surface portion 10B of the semiconductor device 10 and the surface 41B of the insulating layer 41. Resin materials, such as an epoxy-based resin and a polyimide-based resin, can be used as the materials of the insulating layer 42 and the insulating layer 43.

An example of a method of forming the insulating layer 42 is as follows. First, a resin film made of an epoxy-based resin, a polyimide-based resin, or the like is laminated onto the surface 13A of the insulating layer 13 and the surface 41A of the insulating layer 41 so as to cover the wiring pattern 14. Subsequently, the resin film is pressed (pushed). Then, the resin film is hardened by being subjected to a heat treatment at a temperature of, e.g., about 190° C. Thus, the insulating layer 42 can be obtained. Alternatively, first, a liquid resin, such as an epoxy-based resin or a polyimide-based resin, is applied onto the surface 13A of the insulating layer 13 and the surface 41A of the insulating layer 41 so as to cover the wiring pattern 14. Subsequently, the liquid resin is hardened by being subjected to a heat treatment at a temperature of, e.g., about 190° C. Thus, the insulating layer 42 can be obtained. A method of forming the insulating layer 43 is similar to that of forming the insulating layer 42. Thus, the description of the former method is omitted.

Figure 17:
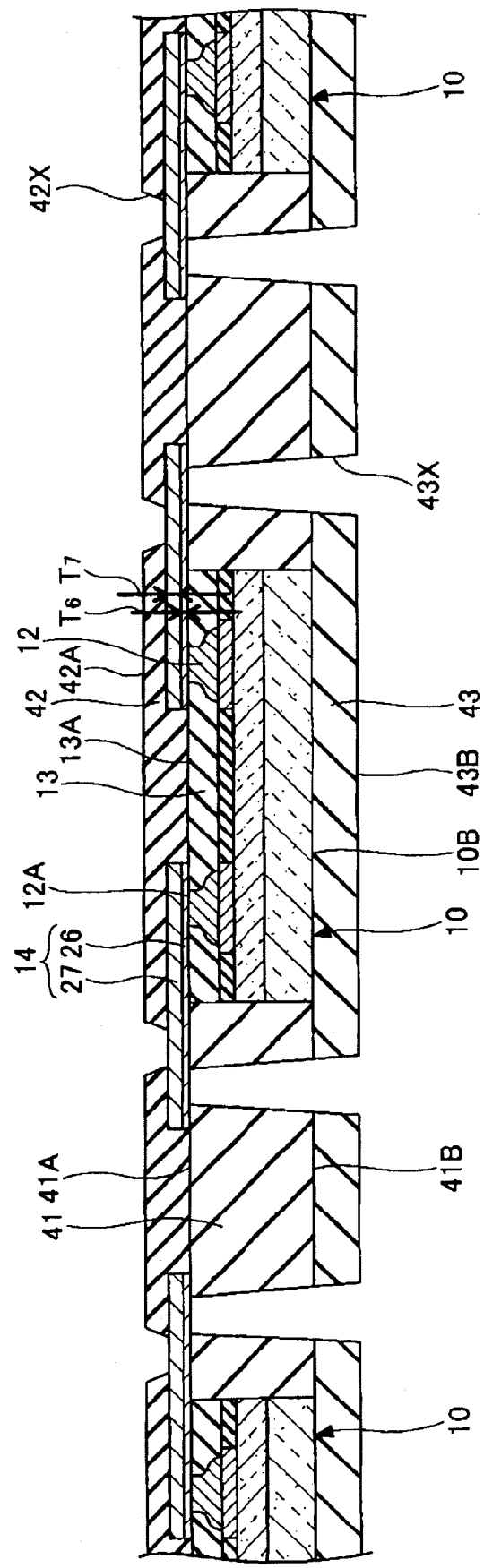
FIG. 17 is an illustration (No. 16)showing a manufacturing method for a semiconductor device embedded substrate according to the first embodiment of the present invention.

Next, in a step illustrated in FIG. 17, a via-hole 42X which is a thorough hole penetrating through the insulating layer 42 is formed using a laser processing method or the like so that one surface of the wiring pattern 14 is exposed. In addition, a via-hole 43X which is a through hole penetrating through the insulating layer 41 and the insulating layer 43 is formed using a laser processing method or the like so that the other surface of the wiring pattern 14 is exposed. For example, a carbon dioxide ($CO_2$) laser and a yttrium aluminum garnet (YAG) laser can be used as the laser. Alternatively, another method can be employed, by which photosensitive resin films are used as the insulating layers 42 and 43, and which via-holes 42X and 43X are formed by performing patterning according to photolithography. Alternatively, another method can be employed, by which via-holes 42X and 43X are formed by performing patterning on resin films that are provided with opening portions by screen-printing.

Figure 18:
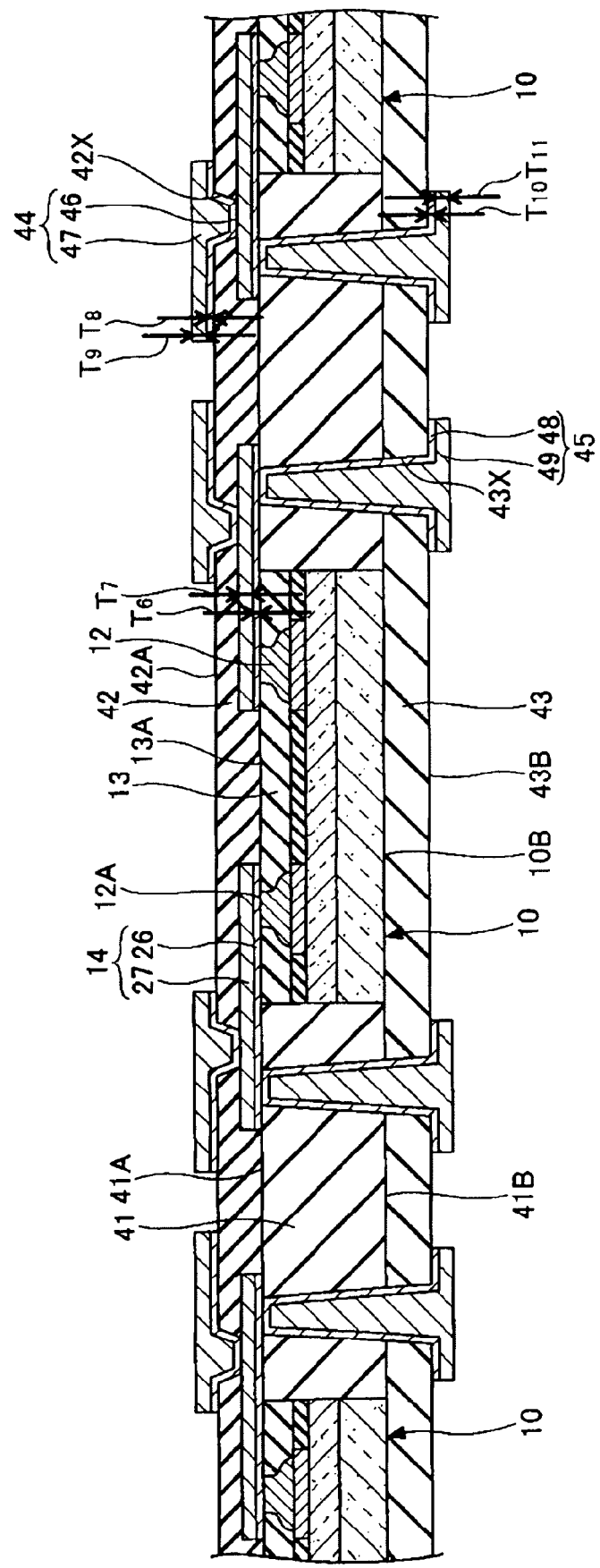
FIG. 18 is an illustration (No. 17)showing a manufacturing method for a semiconductor device embedded substrate according to the first embodiment of the present invention.

Next, in a step illustrated in FIG. 18, the wiring pattern 44 having the metal layer 46 and the metal layer 47 is formed on the surface 42A of the insulating layer 42. In addition, the wiring pattern 45 having the metal layer 48 and the metal layer 49 is formed on the surface 43B of the insulating layer 43. The wiring pattern 44 is electrically connected to the wiring pattern 14 via the via-hole 42X. The wiring pattern 45 is electrically connected to the wiring pattern 14 via the via-hole 43X. The thickness of each of the wiring pattern 44 and the wiring pattern 45 can be set at, e.g., 12 µm.

More specifically, the wiring pattern 44 is formed as described below. First, the metal layer 46 is formed in the surface 42A of the insulating layer 42 and the via-hole 42X. The metal layer 46 is electrically connected to the wiring pattern 14. For example, a layered body including a Cu-layer, another Cu-layer and a Cr-layer, and a layered body including Cu-layer and a Ti-layer can be used as the metal layer 46. Alternatively, an electroless Cu-plating layer can be used as the metal layer 46. Further alternatively, a metal thin film layer formed by a vapor-deposition method, a coating method, or a chemical vapor deposition (CVD) method can be used as the metal layer 46. Alternatively, a metal thin film layer formed by a combination of the aforementioned methods of forming a metal layer can be used as the metal layer 46. The thickness $T_8$ of the metal layer 46 can be set at, e.g., 2 µm.

Next, each metal layer 47 is formed by an electrolytic plating method using the metal layer 46 as an electrical-power feeding layer so as to cover the surface of the metal layer 46. For example, a Cu-layer can be used as the metal layer 47. The thickness $T_9$ of the metal layer 47 can be set at, e.g., 10 µm. Then, resist is applied onto the surface of the metal layer 47. This resist is exposed and developed by a photolithography method. Thus, a resist film is formed on the top portion of the metal layer 47, which corresponds to a region in which the wiring pattern 44 is formed.

Next, the metal layer 46 and the metal layer 47 are etched using the resist films as masks. Thus, a part of the metal layer 46 and the metal layer 47, which corresponds to a portion on which no resist film is formed, is removed to thereby form the wiring pattern 44. Subsequently, the resist film is removed. Then, the roughening of the wiring pattern 44 is performed. The roughening of the wiring pattern 44 can be performed by a method, such as a blackening method or a roughening etching method. The roughening aims at enhancement of the adhesiveness between the wiring pattern 44 and the solder resist layer 16 formed on each of the top surface and the side surface of the wiring pattern 44. A method of forming the wiring pattern 45 is similar to that of forming the wiring pattern 44. Thus, the description of the former method is omitted.

Figure 19:
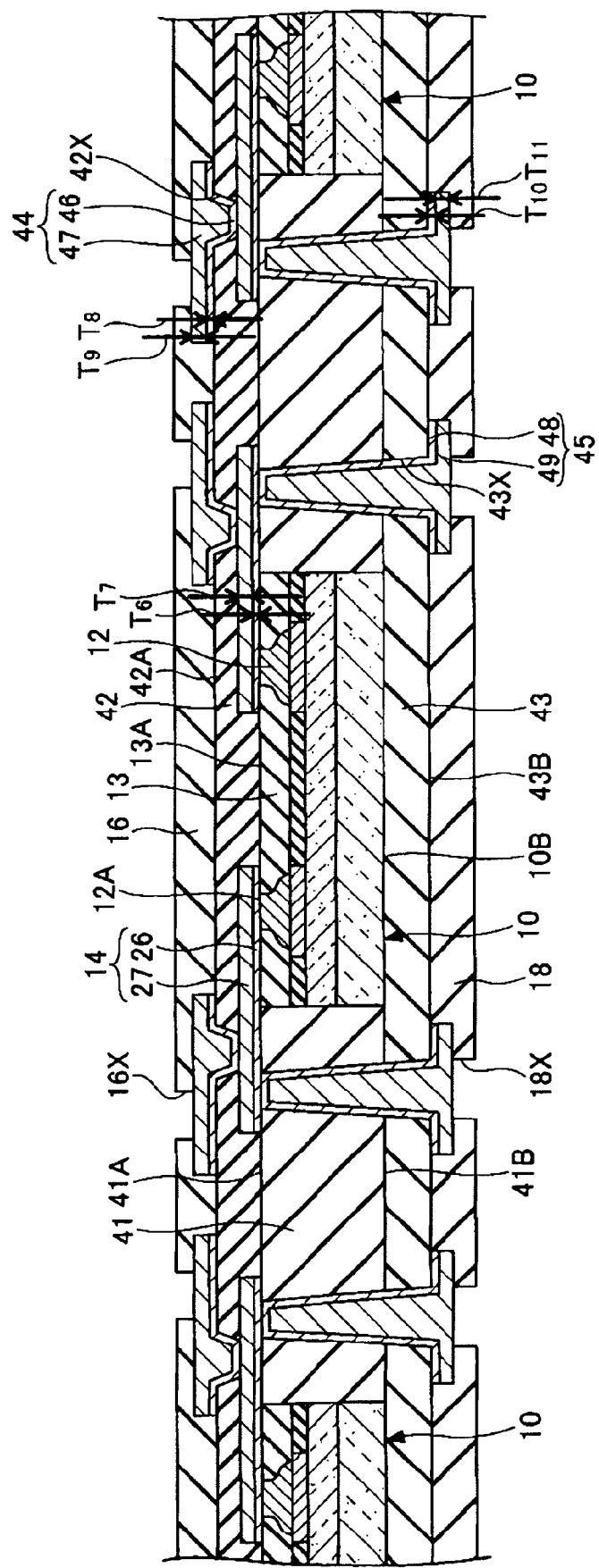
FIG. 19 is an illustration (No. 18)showing a manufacturing method for a semiconductor device embedded substrate according to the first embodiment of the present invention.

Next, in a step illustrated in FIG. 19, the solder resist layer 16 having the opening portion 16X, from which a part of the wiring pattern 44 is exposed, is formed to cover the wiring pattern 44 and the surface 42A of the insulating layer 42. In addition, the solder resist layer 18 having the opening portion 18X is formed to cover the wiring pattern 45 and the surface 43B of the insulating layer 43.

More specifically, e.g., a photosensitive resin composition is first applied to cover the wiring pattern 44 and the surface 42A of the insulating layer 42. Then, the photosensitive resin composition is exposed and developed according to a photolithography method. The photosensitive resin composition corresponding to the external connection terminal 17 is removed by etching. Thus, the opening portion 16X, from which a part of the wiring pattern 44 is exposed, is formed to thereby form the solder resist layer 16 having the opening portion 16X. A method of forming the solder resist layer 18 is similar to that of forming the solder resist layer 16. Therefore, the description of the former method is omitted.

Figure 20:
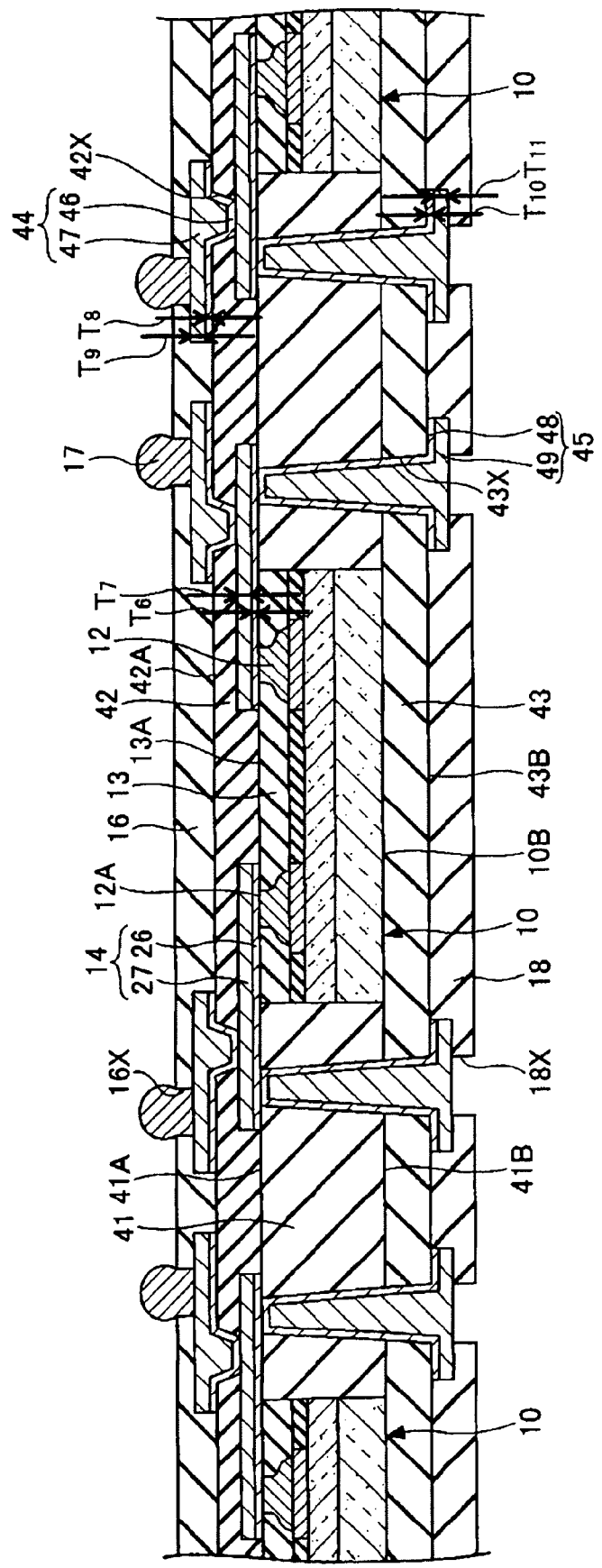
FIG. 20 is an illustration (No. 19)showing a manufacturing method for a semiconductor device embedded substrate according to the first embodiment of the present invention.

Next, in a step illustrated in FIG. 20, the external communication terminal 17 is formed on the wiring pattern 44, which is exposed in the opening portion 16X, and/or on the wiring pattern 45, which is exposed in the opening portion 18X. For example, each solder bump or the like can be used as the external connection terminal 17. For examples, an alloy including lead (Pb), an alloy including Sn and Cu, an alloy including Sn and Ag, and an alloy including Sn, Ag, and Cu can be used as the material of the external connection terminal 17. Alternatively, solder balls (Sn-3.5 Ag) using a resin (e.g., divinylbenzene) as a core can be used. Consequently, a plurality of structures respectively corresponding to the semiconductor device embedded substrates 20 are formed.

Figure 21:
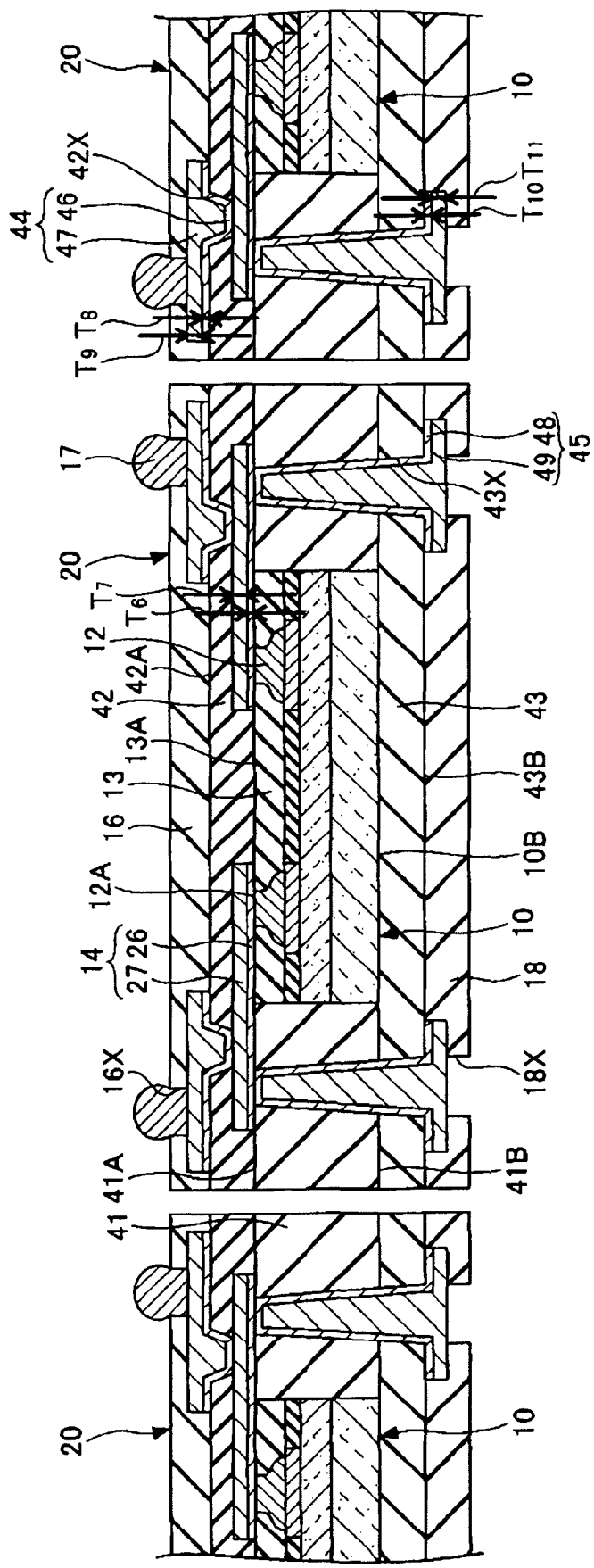
FIG. 21 is an illustration (No. 20)showing a manufacturing method for a semiconductor device embedded substrate according to the first embodiment of the present invention.

Next, in a step illustrated in FIG. 21, each of the structures illustrated in FIG. 20 is cut substantially at the center of the insulating layer 41. Thus, a plurality of semiconductor device embedded substrates 20 are formed. The cutting of each of the structures illustrated in FIG. 20 is performed by, e.g., dicing.

The above is a manufacturing method for a semiconductor device embedded substrate according to the first embodiment of the invention.

According to the first embodiment of the invention, first, each semiconductor device 10, in which the surface 12A of the connection terminal 12 is exposed from the insulating layer 13, is manufactured. Then, the insulating layer 41 is formed to fill at least a space portion adjoining a side surface of each semiconductor device 10. In addition, the wiring pattern (rewiring-wire) 14 is formed, which is electrically connected to the connection terminal 12 so as to be contacted with the surface 12A of the connection terminal 12. Consequently, a step of drilling the insulating layer with a laser to thereby expose the connection terminal is unnecessary. Accordingly, increase in the manufacturing cost of the semiconductor device embedded substrate 20 can be restrained.

In addition, because the step of drilling the insulating layer with a laser to thereby expose the connection terminal is unnecessary, the intervals of the connection terminals 12 is not restricted by the spot diameter (e.g., the diameter is about 70 μm) of laser-light. Consequently, the interval of the connection terminals 12 for electrically connecting the wiring pattern (wiring-wire) 14 to the semiconductor integrated circuit 22 that the semiconductor device 10 has can be extremely reduced. The interval of the connection terminals 12 can be extremely reduced to a value comparable with the line width (set to be equal to the space width) determined by an L/S (line/space) of the wiring pattern (e.g., the interval is equal to or less than 100 μm, and the minimum interval is about 1 μm).

In addition, the insulating layer 43 and the wiring pattern 45 are formed by being stacked on the surface 41B of the insulating layer 41 to provide a via-hole 43X penetrating through the insulating layers 41 and 43. Accordingly, the wiring pattern 14 formed on the surface 41A of the insulating layer 41 can easily be connected to the wiring pattern 45 formed on the side of the surface 41B of the insulating layer 41 via the via-hole 43X.

Second Embodiment

Figure 22:
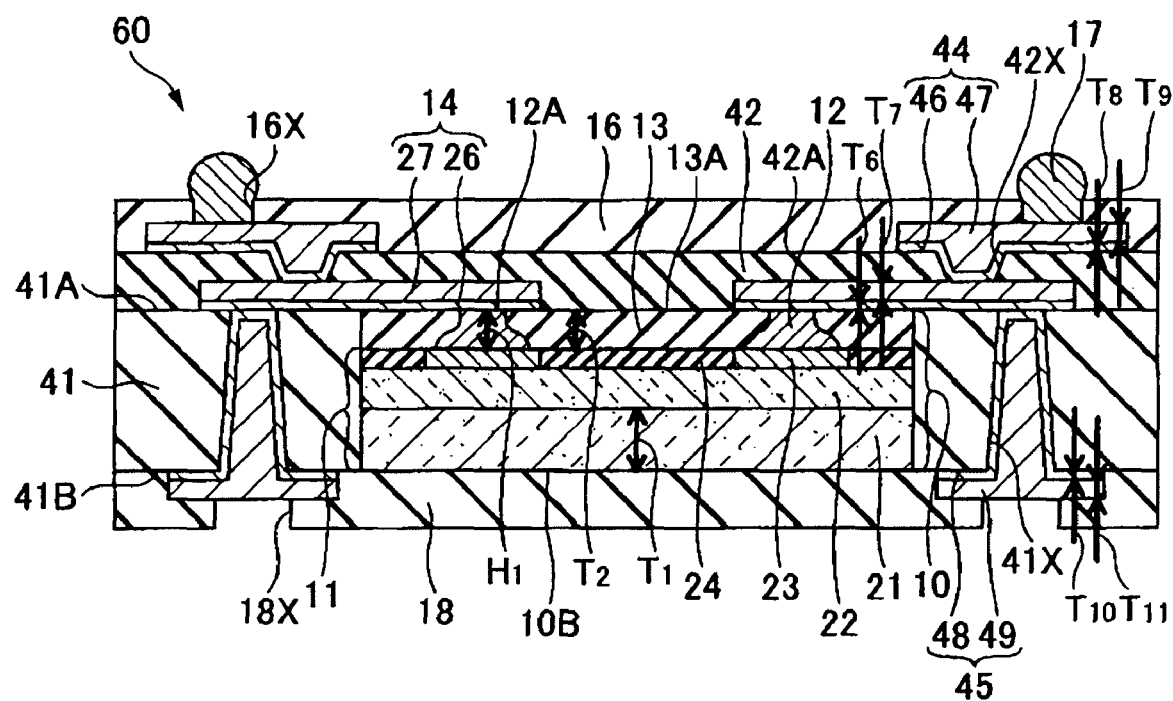
FIG. 22 is an illustration showing a manufacturing method for a semiconductor device embedded substrate according to the second embodiment of the present invention.

Structure of Semiconductor Device Embedded Substrate According to Second Embodiment of the Invention First, the structure of a semiconductor device embedded substrate according to a second embodiment of the invention is described below. FIG. 22 is a cross-sectional view illustrating the semiconductor device embedded substrate according to the second embodiment of the invention. In a semiconductor device embedded substrate 60 illustrated in FIG. 22, the same component as that of the semiconductor device embedded substrate 20 illustrated in FIG. 1 is designated with the same reference numeral. The description of some of such components is omitted. Referring to FIG. 22, the semiconductor device embedded substrate 60 includes the semiconductor device 10, the wiring patterns 14, 44, and 45, the insulating layers 41 and 42, and the solder resist layers 16 and 18, and the external connection terminal 17. Referring to FIG. 22, the semiconductor device embedded substrate 60 according to the second embodiment is similar to the semiconductor device embedded substrate 202 except that the semiconductor device embedded substrate 60 does not have the insulating layer 43. Hereinafter, only the differences between the semiconductor device embedded substrates 60 and 20 are described.

In the semiconductor device embedded substrate 60, the wiring pattern 45 is provided under the surface 41B of the insulating layer 41. The wiring pattern 45 is electrically connected to the wiring pattern 14 via a via-hole 41X.

The wiring pattern 45 has the metal layers 48 and 49.

For example, a layered body including a Cu-layer, another Cu-layer and a Cr-layer, and a layered body including Cu-layer and a Ti-layer can be used as the metal layer 48. Alternatively, an electroless Cu-plating layer can be used as the metal layer 48. Further alternatively, a metal thin film layer formed by a vapor-deposition method, a coating method, or a chemical vapor deposition (CVD) method can be used as the metal layer 48. Alternatively, a metal thin film layer formed by a combination of the aforementioned methods of forming a metal layer can be used as the metal layer 48. The thickness $T_{10}$ of the metal layer 48 can be set at, e.g., 2 μm. For example, a Cu-layer can be used as the metal layer 49. The thickness $T_{11}$ of the metal layer 49 can be set at, e.g., 10 μm.

The wiring pattern 45 is not formed on the rear surface portion 10B of the semiconductor device 10. This is because an internal wiring-wire (not shown) of the semiconductor device 10 is electrically connected to the wiring pattern 45 when the wiring pattern 45 is formed on the rear surface portion 10B of the semiconductor device 10 through no insulating layer.

The solder resist layer 18 is provided on the surface 41B of the insulating layer 41 and the rear surface portion 10B of the semiconductor device 10 to cover the wiring pattern 45. The solder resist layer 18 has the opening portion 18X from which a part of the wiring pattern 45 is exposed. The material of the solder resist layer 18 is, e.g., a photosensitive resin composition.

The above is the structure of a semiconductor device embedded substrate according to the second embodiment of the invention.

Figure 23:
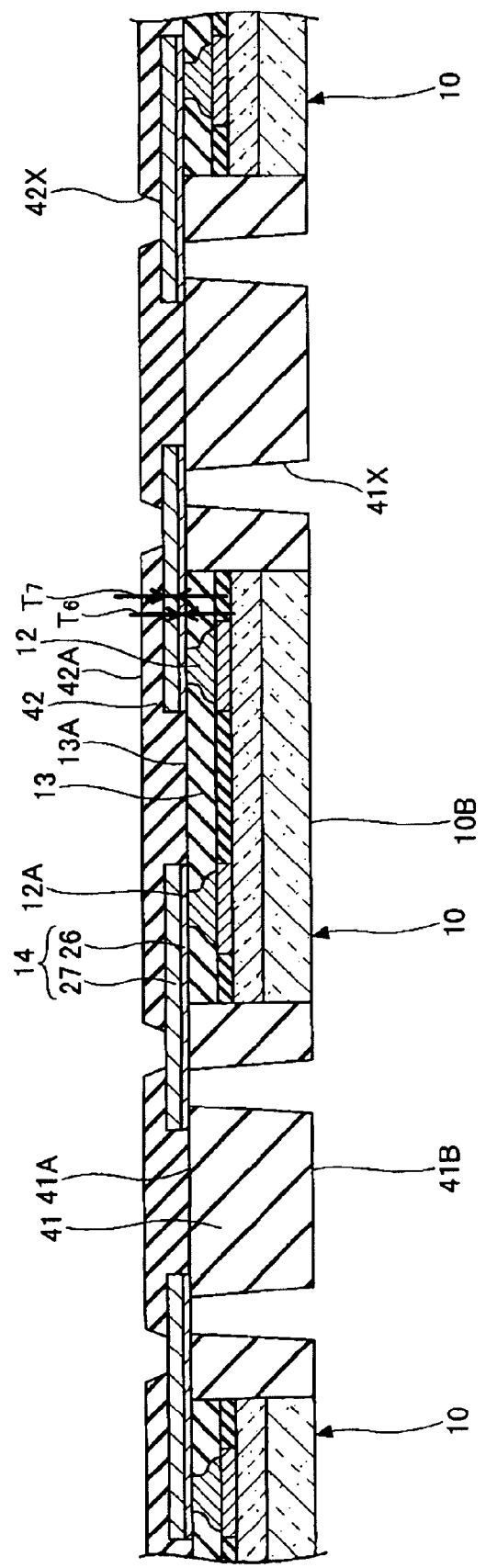
FIG. 23 is an illustration (No. 1)showing a manufacturing method for a semiconductor device embedded substrate according to the second embodiment of the present invention.
Figure 24:
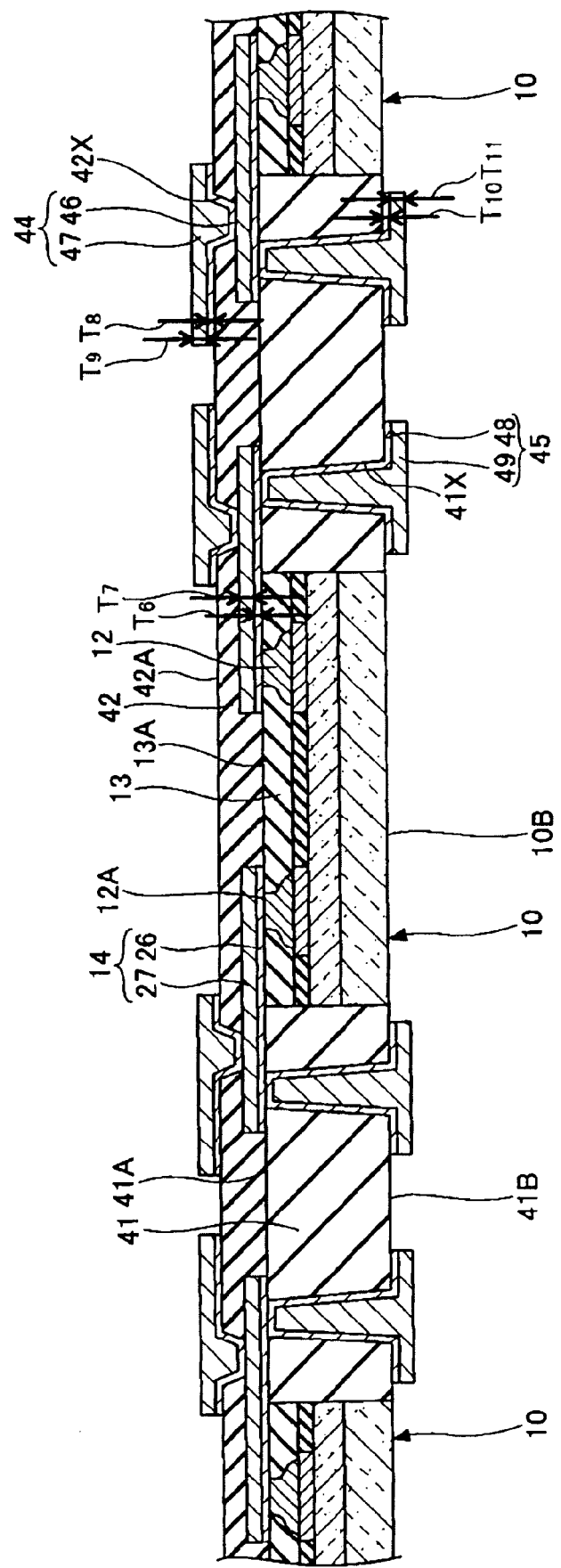
FIG. 24 is an illustration (No. 2)showing a manufacturing method for a semiconductor device embedded substrate according to the second embodiment of the present invention.

Manufacturing Method for Semiconductor Device Embedded Substrate according to Second Embodiment of the Invention Next, a manufacturing method for a semiconductor device embedded substrate according to the second embodiment of the invention is described below. FIGS. 23 and 24 are views each exemplifying a process of manufacturing a semiconductor device embedded substrate according to the second embodiment of the invention. In FIGS. 23 and 24, the same component parts as those of the semiconductor device embedded substrate 60 illustrated in FIG. 22 are designated with the same reference numeral. The description of some of such component parts is omitted.

First, a process similar to that illustrated in FIGS. 2 to 15 according to the first embodiment is performed. Then, in the process illustrated in FIG. 23, the insulating layer 42 is formed on the surface 13A of the insulating layer 13 and the surface 41A of the insulating layer 41 of each structure illustrated in FIG. 15 to cover the wiring pattern 14. An epoxy-based resin, a polyimide-based resin, or the like can be used as the material of the insulating layer 42. Then, the via-hole 42X penetrating through the insulating layer 42 is formed by employing a laser processing method so that one surface of the wiring pattern 14 is exposed. In addition, the via-hole 41X penetrating through the insulating layer 41 is formed by employing a laser processing method so that the other surface of the wiring pattern 14 is exposed. For example, a $CO_2$ laser and a YAG laser can be used as the laser. Alternatively, another method can be used, in which a photosensitive resin film is used as the insulating layer 42, and by which the via-hole 42X is formed by performing patterning according to photolithography. Alternatively, another method can be used, by which the via-hole 42X is formed by performing patterning on a resin film that is provided with an opening portion by screen-printing.

Next, in a step illustrated in FIG. 24, the wiring pattern 44 having the metal layer 46 and the metal layer 47 is formed on the surface 42A of the insulating layer 42. In addition, the wiring pattern 45 having the metal layer 48 and the metal layer 49 is formed on the surface 41B of the insulating layer 41. The wiring pattern 44 is electrically connected to the wiring pattern 14 via the via-hole 42X. The wiring pattern 45 is electrically connected to the wiring pattern 14 via the via-hole 41X. The wiring pattern 44 and the wiring pattern 45 are similar to those of the first embodiment. Thus, the description of the details of the wiring pattern 44 and the wiring pattern 45 is omitted. For the above reason, the wiring pattern 45 is not formed on the rear surface portion 10B of the semiconductor device 10.

Subsequently, processing similar to that in steps respectively illustrated in FIGS. 19 to 21 is performed. Thus, a plurality of semiconductor device embedded substrates 60 are manufactured.

The above is a manufacturing method for a semiconductor device embedded substrate according to the second embodiment of the invention.

According to the second embodiment of the invention, advantages similar to those of the first embodiment of the invention can be obtained. Because the step of forming the insulating layer 43 is eliminated, the step of manufacturing the semiconductor device embedded substrate 60 can be simplified.

In the foregoing description, preferred embodiments of the invention have been described in detail. However, the invention is not limited to the aforementioned embodiments. Various modifications and substitutions can be added to the aforementioned embodiments without departing from the scope of the invention.

For example, insulating layers and wiring patterns are alternately formed on the side of the surface 41A of the insulating layer 41 and/or the side of the surface 41B of the insulating layer 41. Thus, a semiconductor device embedded substrate having a multilayer wiring pattern (build-up wiring layer) can be implemented.

What is claimed is:

1. A manufacturing method for a semiconductor device embedded substrate, comprising:
   a first step of preparing a semiconductor device that has a semiconductor integrated circuit, a connection terminal electrically connected to the semiconductor integrated circuit, a first insulating layer configured to expose a part of the connection terminal;
   a second step of preparing a support body, and arranging the semiconductor device on one surface of the support body so that an exposed portion of the connection terminal, which is exposed from the first insulating layer, faces the one surface of the support body;
   a third step of forming a second insulating layer on the one surface of the support body to fill at least a space portion adjoining each side surface of the semiconductor device arranged on the one surface of the support body;
   a fourth step of removing the support body;
   a fifth step of forming a first wiring pattern to be electrically connected to an exposed portion from the fourth step on a surface of each of the first insulating layer and the second insulating layer which are set so that the surface thereof is at the side of the exposed portion;
   a sixth step of forming a first via-hole, from which the first wiring pattern is exposed, in the second insulating layer; and
   a seventh step of forming a second wiring pattern to be electrically connected via the first via-hole to the first wiring pattern on a surface of the second insulating layer, which is set so that the surface therof is opposite to the exposed portion.

2. The manufacturing method for a semiconductor device embedded substrate according to claim 1, further comprising:
   an eighth step of alternately forming an insulating layer and a wiring pattern so as to cover the first wiring pattern.

3. The manufacturing method for a semiconductor device embedded substrate according to claim 1, further comprising:
   an eighth step of alternately forming an insulating layer and a wiring pattern so as to cover the second wiring pattern.

4. The manufacturing method for a semiconductor device embedded substrate according to claim 1, wherein
   the first step comprises the steps of:
   forming the connection terminal on an electrode pad formed on the semiconductor integrated circuit;
   forming the first insulating layer on the semiconductor integrated circuit to cover the connection terminal;
   providing a plate-like body on the first insulating layer, a surface of the plate-like body opposite to the first insulating layer, having a rough surface;
   exposing a part of the connection terminal from the first insulating layer by attaching the rough surface of the plate-like body to the first insulating layer by pressure; and
   removing the plate-like body.

5. A manufacturing method for a semiconductor device embedded substrate, comprising:
   a first step of preparing a semiconductor device that has a semiconductor integrated circuit, a connection terminal electrically connected to the semiconductor integrated circuit, a first insulating layer configured to expose a part of the connection terminal;
   a second step of preparing a support body, and arranging the semiconductor device on one surface of the support body so that an exposed portion of the connection terminal, which is exposed from the first insulating layer, faces the one surface of the support body;
   a third step of forming a second insulating layer on the one surface of the support body to fill at least a space portion adjoining each side surface of the semiconductor device arranged on the one surface of the support body;
   a fourth step of removing the support body;
   a fifth step of forming a first wiring pattern to be electrically connected to an exposed portion from the fourth step on a surface of each of the first insulating layer and the second insulating layer which are set so that the surface thereof is at the side of the exposed portion;
   a sixth step of forming a third insulating layer on a surface of each of the semiconductor device and the second insulating layer, each of which is set so that the surface thereof is opposite to the exposed portion;
   a seventh step of forming a first via-hole, from which the first wiring pattern is exposed, in the second insulating layer; and
   an eighth step of forming a second wiring pattern to be electrically connected via the first via-hole to the first wiring pattern in the second insulating layer, wherein
   in the seventh step, the first via-hole, from which the first wiring pattern is exposed, is formed in each of the second insulating layer and the third insulating layer, and
   in the eighth step, the second wiring pattern to be electrically connected via the first via-hole to the first wiring pattern is also formed on the third insulating layer.

* * * * *